(12) United States Patent
Morimoto et al.

(10) Patent No.: US 11,342,901 B2
(45) Date of Patent: May 24, 2022

(54) CRYSTAL RESONATOR PLATE AND CRYSTAL RESONATOR DEVICE

(71) Applicant: Daishinku Corporation, Kakogawa (JP)

(72) Inventors: Yoshinari Morimoto, Kakogawa (JP); Ryota Yamauchi, Kakogawa (JP)

(73) Assignee: Daishinku Corporation, Kakogawa (JP)

( * ) Notice: Subject to any disclaimer, the term of this patent is extended or adjusted under 35 U.S.C. 154(b) by 619 days.

(21) Appl. No.: 16/327,293

(22) PCT Filed: Jul. 31, 2017

(86) PCT No.: PCT/JP2017/027665
§ 371 (c)(1),
(2) Date: Feb. 21, 2019

(87) PCT Pub. No.: WO2018/042994
PCT Pub. Date: Mar. 8, 2018

(65) Prior Publication Data
US 2019/0229704 A1    Jul. 25, 2019

(30) Foreign Application Priority Data

Aug. 30, 2016    (JP) .............................. JP2016-167646

(51) Int. Cl.
*H03H 9/19* (2006.01)
*H03H 9/02* (2006.01)
(Continued)

(52) U.S. Cl.
CPC ................ *H03H 9/19* (2013.01); *H03H 9/02* (2013.01); *H03H 9/02149* (2013.01);
(Continued)

(58) Field of Classification Search
CPC .......... H03H 9/17; H03H 9/02; H03H 9/1035; H03H 9/02149; H03H 9/177; H03H 9/19
See application file for complete search history.

(56) References Cited

U.S. PATENT DOCUMENTS 7,015,631 B2 *   3/2006   Hirasawa ................. H03H 9/09
                                                310/370
2007/0252480 A1 * 11/2007 Tsuchido ............. H03H 9/1035
                                                310/340
(Continued)

FOREIGN PATENT DOCUMENTS

JP         2010-087575 A     4/2010
JP         2013-098814 A     5/2013
(Continued)

*Primary Examiner* — J. San Martin
(74) *Attorney, Agent, or Firm* — Metrolex IP Law Group, PLLC

(57) ABSTRACT

An AT-cut crystal resonator plate includes: a vibrating part having a rectangular shape in plan view that is disposed on a center of the AT-cut crystal resonator plate and that has excitation electrodes respectively formed on a first and a second main surfaces; a cut-out part having a rectangular shape in plan view that is formed along an outer periphery of the vibrating part; an external frame part having a rectangular shape in plan view that is formed along an outer periphery of the cut-out part; and a connecting part that connects the vibrating part to the external frame part and that extends, in a Z' axis direction of the vibrating part, from one end part of a side of the vibrating part along an X axis direction. The connecting part includes wide parts whose widths gradually increase only toward the external frame part.

10 Claims, 8 Drawing Sheets

(51) Int. Cl.
*H03H 9/10* (2006.01)
*H03H 9/17* (2006.01)

(52) U.S. Cl.
CPC ...... *H03H 9/02157* (2013.01); *H03H 9/1035* (2013.01); *H03H 9/177* (2013.01)

(56) References Cited

U.S. PATENT DOCUMENTS

| | | | |
|---|---|---|---|
| 2009/0066191 A1* | 3/2009 | Tsuchido | H03H 9/1035 310/353 |
| 2009/0108709 A1* | 4/2009 | Tsuchido | H03H 9/177 310/364 |
| 2010/0079040 A1 | 4/2010 | Iwai et al. | |
| 2010/0147074 A1* | 6/2010 | Ichikawa | H03H 9/21 73/504.16 |
| 2013/0106247 A1 | 5/2013 | Ariji et al. | |
| 2015/0015119 A1 | 1/2015 | Takahashi et al. | |
| 2016/0322952 A1 | 11/2016 | Iizuka et al. | |
| 2018/0006630 A1 | 1/2018 | Kojo | |

FOREIGN PATENT DOCUMENTS

| | | |
|---|---|---|
| JP | 2015-019240 A | 1/2015 |
| JP | 2015-122652 A | 7/2015 |
| WO | WO 2016/121182 A1 | 8/2016 |

* cited by examiner

CRYSTAL RESONATOR PLATE AND CRYSTAL RESONATOR DEVICE

TECHNICAL FIELD

The present invention relates to an AT-cut crystal resonator plate including a first excitation electrode formed on a first main surface and a second excitation electrode formed on a second main surface, and also to a crystal resonator device including the above crystal resonator plate.

BACKGROUND ART

Recent years, in various electronic devices, their operating frequencies have increased and their packages (especially, their height) have been downsized. According to such an increase in operating frequency and a reduction in package size, there is also a need for crystal resonator devices to be adaptable to the increase in operating frequency and the reduction in package size.

In this kind of crystal resonator devices adapted to miniaturization, a housing is constituted of a rectangular parallelepiped-shaped package. The package is constituted of: a first sealing member and a second sealing member each made of a brittle material such as glass or crystal; and a crystal resonator plate having excitation electrodes on both main surfaces thereof. The first sealing member and the second sealing member are laminated and bonded via the crystal resonator plate. Thus, the excitation electrodes of the crystal resonator plate, which are disposed inside the package, are hermetically sealed (for example, see Patent Document 1 listed below). Such a laminated structure of the crystal resonator device is generally called as a sandwich structure.

PRIOR ART DOCUMENT

Patent Document

Patent Document 1: JP 2015-122652 A

SUMMARY OF THE INVENTION

Problem to Be Solved by the Invention

In the above-described crystal resonator device having the sandwich structure, functional regions of the crystal resonator plate include: a region serving as a vibrating part to excite as a crystal resonator; a region serving as an external frame part to hermetically seal the vibrating part by bonding the crystal resonator plate to a sealing member; a region serving as a cut-out part to separate the external frame part from the vibrating part so as not to prevent the excitation of the vibrating part due to the external frame part; a region serving as a connecting part to connect the vibrating part to the external frame part; and a region serving as a wiring part (wiring pattern and a through hole for wiring) to electrically connect wiring of the crystal resonator plate to wiring of the sealing member.

In the above-described crystal resonator device, the configuration of the connecting part sometimes causes, for example: leakage of the vibration when vibration displacement is largely transmitted from the vibrating part to the external frame part, which results in degradation in the efficiency of the piezoelectric vibration; and large bend of the vibrating part due to external impact such as a fall, which results in damage of the connecting part. Especially in the crystal resonator device having the sandwich structure, it is actually difficult to realize the following at the same time by only designing the connecting part: reduction in bad influence caused by leakage of the vibration; and improvement of the impact resistance.

In order to solve the above problem, an object of the present invention is to provide a highly reliable crystal resonator plate in which the impact resistance is improved and the degradation in the electrical characteristics is reduced, and also to provide a crystal resonator device including the crystal resonator plate.

Means for Solving the Problem

In order to achieve the above object, an AT-cut crystal resonator plate of the present invention, which has a rectangular shape in plan view, includes: a first main surface; a second main surface; a vibrating part having a rectangular shape in plan view, which is disposed on a center part of the AT-cut crystal resonator plate so as to have a first excitation electrode on the first main surface and to have a second excitation electrode on the second main surface; a cut-out part formed along an outer periphery of the vibrating part; an external frame part having a rectangular-shaped inner peripheral edge in plan view, which is formed along an outer periphery of the cut-out part; and a connecting part configured to connect the vibrating part to the external frame part, which extends, in a Z' axis direction of the vibrating part, from one end part of a side of the vibrating part along an X axis direction, so as to be connected to only the inner peripheral edge of the external frame part along the X axis direction. A wide part is formed on a side surface of the connecting part on a +X axis side such that a width of the wide part gradually increases from the vibrating part only toward the external frame part.

In the above configuration, the connection between the vibrating part and the external frame part is realized by only one connecting part that extends, in the Z' axis direction of the vibrating part, from one end part of a side of the vibrating part along the X axis direction, so as to be connected to only the inner peripheral edge of the external frame part along the X axis direction. Thus, the connecting part is not formed to be extended along the X axis direction that is an axis direction in which the vibration displacement distribution increases in the AT-cut vibrating part. Also, in the vibrating part having the rectangular shape in plan view, the vibration displacement is smallest at a corner part (at the end part of the side in the X axis direction). In addition, since the connecting part is connected to only one side that is the inner peripheral edge of the external frame part along the X axis direction, the vibration is not transmitted and thus is not leaked to multiple parts (in multiple directions) other than the inner peripheral edge along the X axis direction. For this reason, the leakage of the vibration from the vibrating part to the external frame part exerts less influence, which results in more efficient piezoelectric vibration of the vibrating part of the crystal resonator plate. Also, since the single connecting part connects the vibrating part to the external frame part, it is possible to reduce stress applied to the vibrating part compared to the case in which the multiple connecting parts connect the vibrating part to the external frame part. Thus, the frequency is prevented from being shifted caused by application of stress to the vibrating part due to stress from the external frame part. Therefore, it is possible to cause more stable piezoelectric vibration in the vibrating part of the crystal resonator plate.

When a fall or other external impact in the manufacturing process is applied to the crystal resonator plate, the most easily displacing part of the vibrating part of the crystal resonator plate is a free end of the vibrating part, i.e. the corner part of the vibrating part that is located diagonally with respect to the corner part of the vibrating part to which is connected the connecting part. Also, it is not a joining portion joining the connecting part on the free end side to the vibrating part but a joining portion joining the connecting part on the fixed end side to the external frame part to which strain stress is mostly concentrated due to the displacement of the vibrating part of the crystal resonator plate. Especially, in the joining portion of the connecting part to the external frame part, the maximum stress concentration point is a joining portion adjacent to the corner part at the inner peripheral edge of the external frame part, which is farthest from the free end of the vibrating part. Thus, the connecting part includes at least a wide part that is formed on the side surface of the connecting part on the +X axis side adjacent to the corner part of the inner peripheral edge of the external frame part such that the width of the wide part gradually increases from the vibrating part only toward the external frame part. In this way, it is possible to enhance rigidity of the maximum stress concentration point of the joining portion of the connecting part to the external frame part on the side of the fixed end, and further to disperse strain stress, which is applied to the connecting part due to displacement of the vibrating part of the crystal resonator plate by external impact, into the external frame part. Also, it is possible to remarkably reduce influence caused by vibration leakage from the vibrating part to the external frame part as described above, compared to the case in which the entire connecting part is formed so as to have a large width or in which the connecting part is formed to have a width gradually increasing from the external frame part toward the vibrating part.

With the configuration as described above, the present invention provides a highly reliable crystal resonator plate in which the impact resistance is improved and the degradation in the electrical characteristics is reduced.

In addition to the above configuration, in the present invention, a second wide part may be formed on a side surface of the connecting part on a −X axis side, and when the wide part on the side surface of the connecting part on the +X axis side is defined as a first wide part, the first wide part and the second wide part may be formed so as to have respectively shapes asymmetric to each other.

With the above configuration, it is possible to further enhance the rigidity of the joining portion joining the connecting part on the side of the fixed end to the external frame part, to which the strain stress is likely to concentrate. Also, it is possible to relax the strain stress concentration applied to the joining portion of the connecting part to the external frame part by changing the stress balance between the side surface on the −X axis side and the side surface on the +X axis side of the connecting part.

In addition to the above configuration, in the present invention, the first wide part and the second wide part may be disposed on the connecting part on a −Z' axis side. In this case, a third wide part may be disposed on the side surface of the connecting part on the −X axis side so as to also position on a +Z' axis side of the connecting part, and the third wide part may be formed such that a width thereof gradually decreases from the vibrating part toward the external frame part.

In the above configuration, the connecting part includes the third wide part in addition to the first wide part and the second wide part. Thus, it is possible to enhance the rigidity of the joining portion of the connecting part to the external frame part by the first wide part and the second wide part while enhancing the rigidity of the joining portion of the connecting part to the vibrating part by the third wide part.

In addition to the above configuration, in the present invention, the third wide part may be formed smaller than the first wide part and the second wide part in plan view.

With the above configuration, negative influence on the piezoelectric vibration characteristics such as a spurious emission can be reduced while preventing influence of vibration leakage from the vibrating part to the external frame part via the connecting part.

In addition to the above configuration, in the present invention, an expanded part may be formed on the external frame part such that the expanded part is located at a position diagonal to the connecting part in plan view with a center of the vibrating part being interposed therebetween, and that the expanded part expands from the inner peripheral edge of the external frame part toward the cut-out part.

In the above configuration, the end part of the vibrating part in the vicinity of the free end thereof makes contact with and is supported by the expanded part of the external frame part before the free end of the vibrating part is excessively displaced in the X axis direction. Therefore, when a fall or other external impact in the manufacturing process is applied to the crystal resonator plate, the vibrating part of the crystal resonator plate is prevented from largely bending in the plate surface direction, which contributes to protection of the connecting part from breakage. Furthermore, since the vibrating part is not provided with the expanded part but the external frame part is provided with the expanded part, negative influence on the piezoelectric vibration characteristics such as changes in the vibration displacement area or a spurious emission, which may be caused by the expanded part on the vibrating part, does not occur. Thus, the rigidity of the external frame part is enhanced, which leads to improvement of the impact resistance.

It is preferable that the present invention is applied to a crystal resonator device having a sandwich structure, i.e. a laminated structure including a first sealing member that covers a first main surface of the crystal resonator plate and a second sealing member that covers a second main surface of the crystal resonator plate.

In the above configuration, the crystal resonator plate is sandwiched between the first sealing member and the second sealing member. Thus, it is possible to manufacture a relatively downsized crystal resonator device. Also, since the above-described crystal resonator plate is included, it is possible to realize the downsizing of the crystal resonator device while improving the impact resistance and reducing the degradation in the electrical characteristics.

Effect of the Invention

With the configuration as described above, the present invention provides a highly reliable crystal resonator plate in which the impact resistance is improved and the degradation in the electrical characteristics is reduced.

MODES FOR CARRYING OUT THE INVENTION

Hereinafter, embodiments of the present invention will be described with reference to the drawings. In the embodiments described below, the present invention is applied to a crystal resonator as a crystal resonator device.

Figure 1:
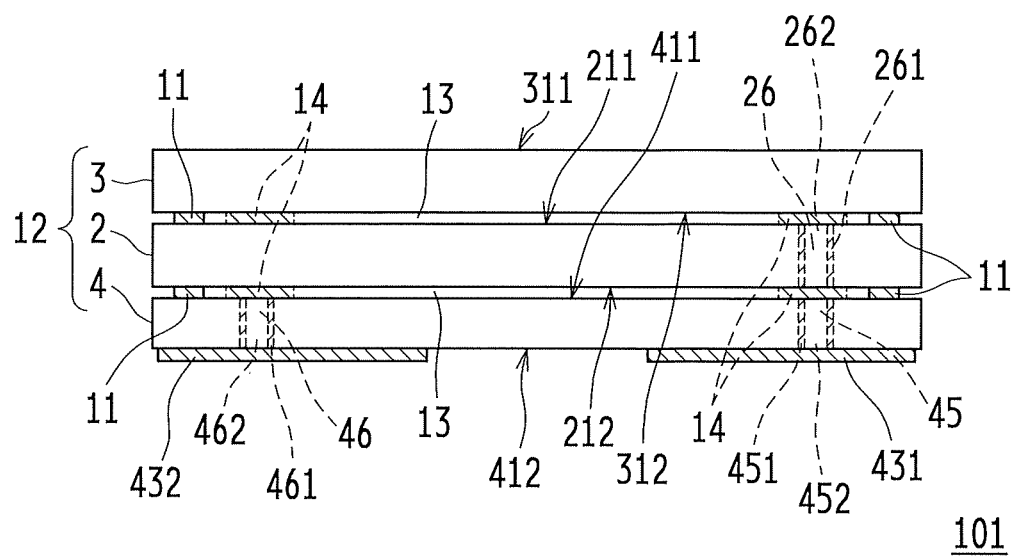
FIG. 1 is a schematic configuration diagram schematically illustrating an overall configuration of a crystal resonator according to an embodiment of the present invention.

As shown in FIG. 1, a crystal resonator 101 according to this embodiment includes: a crystal resonator plate 2; a first sealing member 3 that covers a first excitation electrode 221 (see FIG. 4) of the crystal resonator plate 2 so as to hermetically seal the first excitation electrode 221 that is formed on a first main surface 211 of the crystal resonator plate 2; and a second sealing member 4 disposed on a side of a second main surface 212 of the crystal resonator plate 2 so as to cover a second excitation electrode 222 (see FIG. 5) of the crystal resonator plate 2, the second sealing member 4 hermetically sealing the second excitation electrode 222 that makes a pair with the first excitation electrode 221. In the crystal resonator 101, the crystal resonator plate 2 is bonded to the first sealing member 3, and also the crystal resonator plate 2 is bonded to the second sealing member 4. Thus, a package 12 having a sandwich structure is constituted.

The first sealing member 3 and the second sealing member 4 are bonded to each other via the crystal resonator plate 2. Thus, an internal space 13 of the package 12 is formed. In this internal space 13 of the package 12, a vibrating part 22 is hermetically sealed. The vibrating part 22 includes the first excitation electrode 221 and the second excitation electrode 222 respectively formed on both main surfaces 211 and 212 of the crystal resonator plate 2. The crystal resonator 101 according to this embodiment has, for example, a package size of 1.0×0.8 mm, which is reduced in size and height. According to the size reduction, no castellation is formed in the package 12. Through holes (first to third through holes) are used for conduction between electrodes.

Next, the configuration of the above-described crystal resonator 101 will be described referring to FIGS. 1 to 7. Here, each of the crystal resonator plate 2, the first sealing member 3 and the second sealing member 4 will be described as a single body without being bonded.

Figure 4:
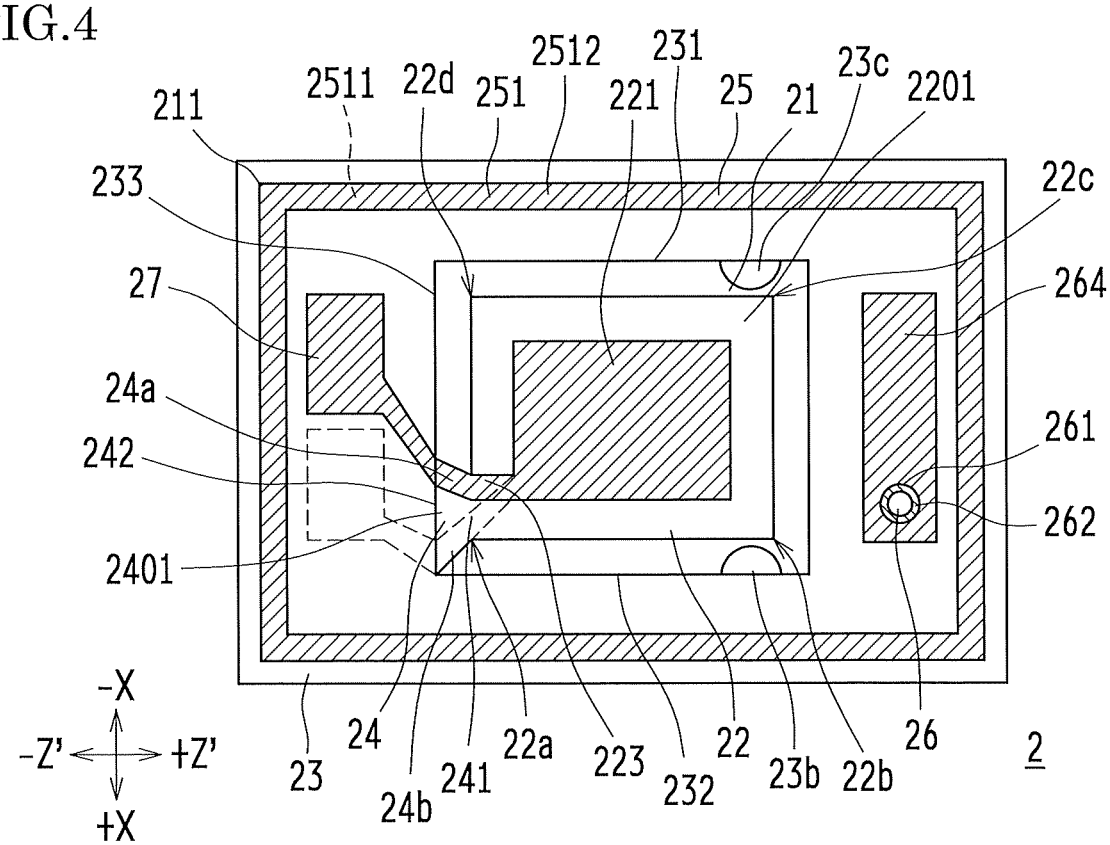
FIG. 4 is a schematic plan view illustrating a crystal resonator plate of the crystal resonator.
Figure 5:
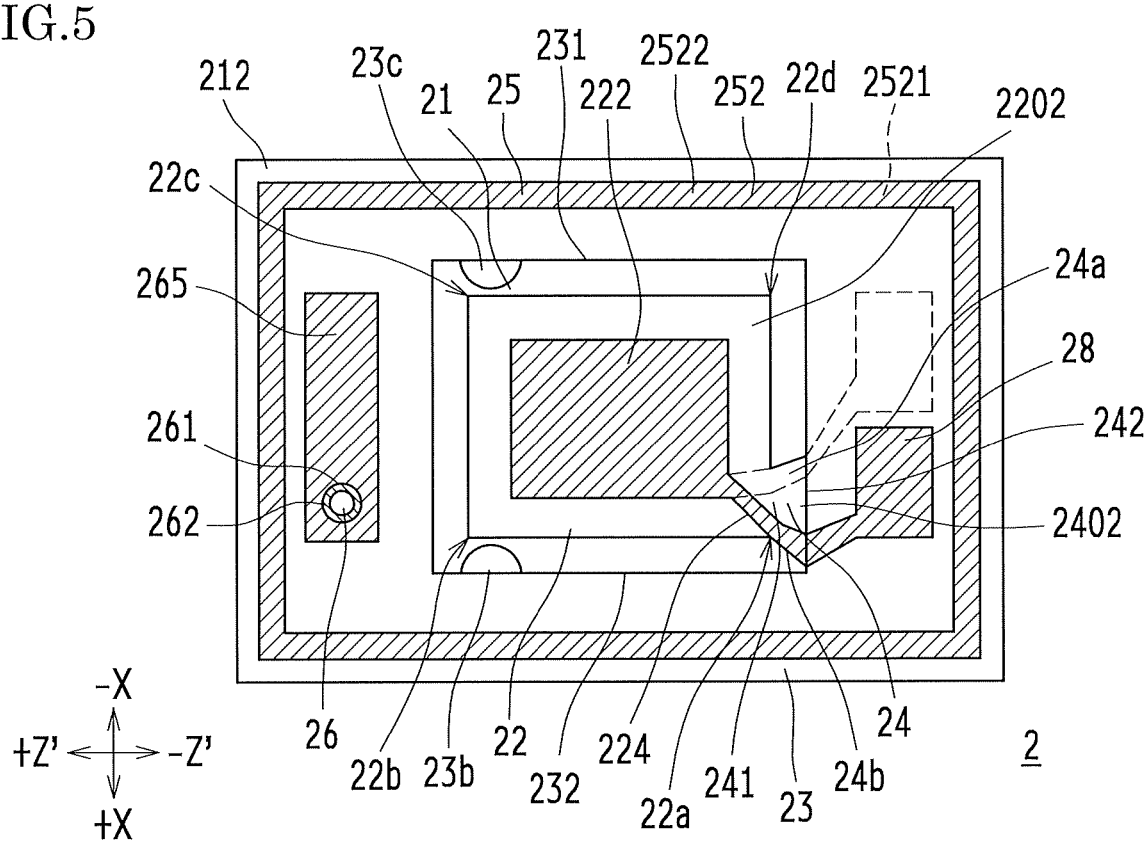
FIG. 5 is a schematic rear view illustrating the crystal resonator plate of the crystal resonator.

As shown in FIGS. 4 and 5, the crystal resonator plate 2 is made of crystal that is a piezoelectric material. Both main surfaces (the first main surface 211 and the second main surface 212) are formed as smooth flat surfaces (mirror-finished). The first main surface 211 and the second main surface 212 are parallel with each other. In this embodiment, an AT-cut crystal plate, which has a rectangular shape in plan view, is used as the crystal resonator plate 2 to cause thickness shear vibration. In the crystal resonator plate 2 shown in FIGS. 4 and 5, both main surfaces 211 and 212 of the crystal resonator plate 2 are an XZ' plane. On this XZ' plane, a direction in parallel with the lateral direction (short side direction) of the crystal resonator plate 2 is the X axis direction, and a direction in parallel with the longitudinal direction (long side direction) of the crystal resonator plate 2 is the Z' axis direction. The AT-cut method is a processing method in which a crystal plate is cut out of synthetic quartz crystal at an angle tilted by 35° 15' about an X axis from a Z axis, out of the three crystal axes (i.e. an electrical axis (X axis), a mechanical axis (Y axis) and an optical axis (Z axis)) of the synthetic quartz crystal. The X axis of the AT-cut crystal plate equals the crystal axis of the crystal. The Y' axis and the Z' axis equal the respective axes that tilt by 35° 15' from the Y axis and the Z axis out of the crystal axes of the crystal. The Y' axis direction and the Z' axis direction correspond to the direction in which the AT-cut crystal is cut out.

The crystal resonator plate 2 has, on the center part thereof, the vibrating part 22 formed so as to have a rectangular shape in plan view. A pair of excitation electrodes (i.e. the first excitation electrode 221 and the second excitation electrode 222) is formed, respectively, on both main surfaces (i.e. the first main surfaces 211 and the second main surface 212) of the vibrating part 22. Extraction electrodes (a first extraction electrode 223 and a second extraction electrode 224), which are eventually connected to external electrode terminals (a first external electrode terminal 431 and a second external electrode terminal 432, described later), are respectively connected to the first excitation electrode 221 and the second excitation electrode 222.

That is, the first excitation electrode 221 is formed on the first main surface of the vibrating part 22 while the second excitation electrode 222 is formed on the second main surface of the vibrating part 22 so as to be opposite to the first excitation electrode 221. The first extraction electrode 223 is extended from the first excitation electrode 221 to an external frame part 23 via a connecting part 24 (described later) so as to be eventually connected to the first external electrode terminal 431. The second extraction electrode 224 is extended from the second excitation electrode 222 to the external frame part 23 via the connecting part 24 (described later) so as to be eventually connected to the second external electrode terminal 432.

The crystal resonator plate 2 also includes: a cut-out part 21 whose outer peripheral edge and the inner peripheral edge each have a rectangular shape in plan view, which is formed along the outer periphery of the vibrating part 22 of the crystal resonator plate 2 so as to penetrate the crystal resonator plate 2 in the thickness direction (i.e. to penetrate between the first main surface 211 and the second main surface 212); the external frame part 23 whose outer peripheral edge and the inner peripheral edge each have a rectangular shape in plan view, which is formed so as to surround the outer periphery of the vibrating part 22 and the cut-out part 21; and one connecting part (holding part) 24 that connects the vibrating part 22 to the external frame part 23, specifically, that is extended in the Z' axis direction of the crystal resonator plate 2 and connected to only one side along the inner peripheral edge 233 of the external frame part 23 in the X axis direction. The crystal resonator plate 2 has a configuration in which the vibrating part 22, the connecting part 24 and the external frame part 23 are integrally formed. The respective main surfaces (the respective first main surfaces and the respective second main surfaces) of the vibrating part 22, the connecting part 24 and the external frame part 23 are formed so as to be the same plane or parallel planes having different thicknesses. In this embodiment, the vibrating part 22 and the connecting part 24 have the same thickness while the external frame part 23 is formed so as to have the thickness larger than the above thickness. Therefore, the respective main surfaces (the respective first main surfaces and the respective second main surfaces) of the vibrating part 22 and the connecting part 24 are respectively the same plane while the respective main surfaces (the first main surface and the second main surface) of the external frame part 23 are planes respectively parallel to the corresponding main surfaces (the first main surfaces or the second main surfaces) of the vibrating part 22 and the connecting part 24.

The present invention is not limited to the above. The respective thicknesses of the vibrating part 22 and the connecting part 24 may be changed. For example, the external frame part 23 may be formed so as to have the largest thickness, the vibrating part 22 to have the second largest thickness, and the connecting part 24 to have the smallest thickness. Also, the vibrating part 22 may have a mesa structure or a reverse mesa structure by including a region having a different thickness. Such a difference in the thickness between the external frame part 23 and the connecting part 24 leads to difference in the natural frequency of piezoelectric vibration between the external frame part 23 and the connecting part 24, or between the connecting part 24 and the vibrating part 22, which prevents resonance.

Figure 8:
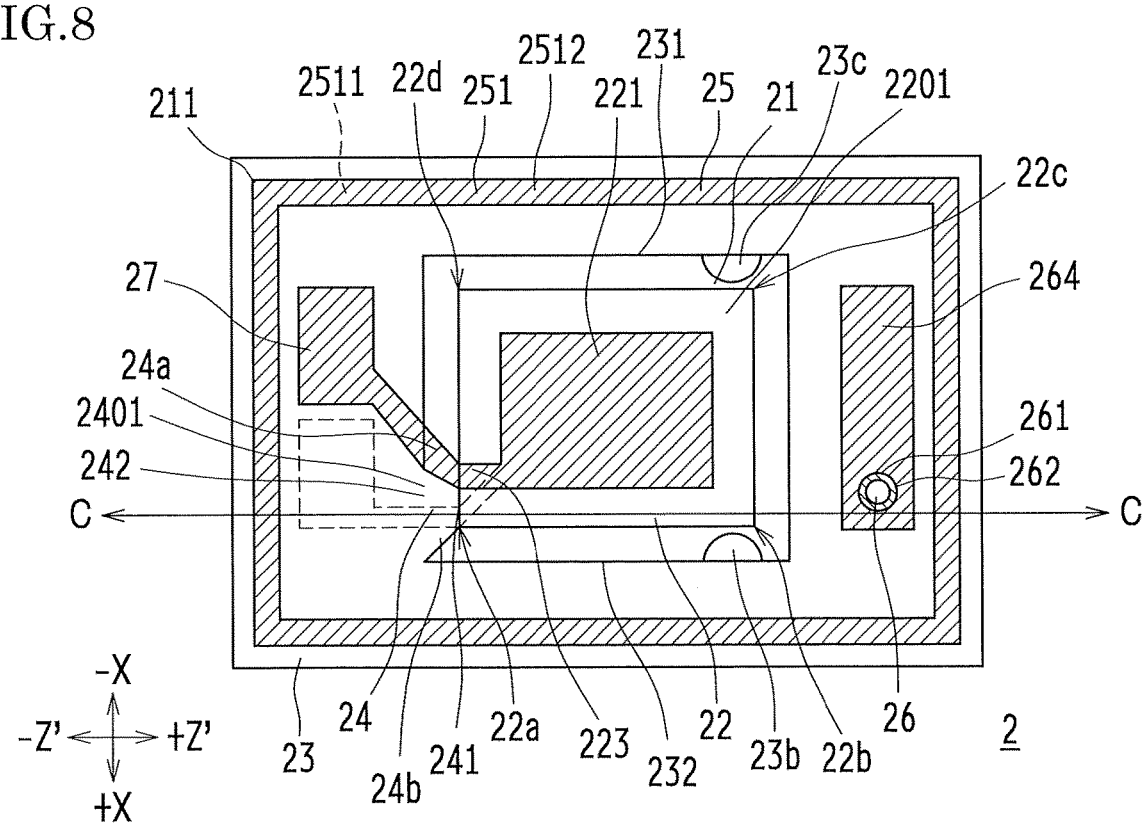
FIG. 8 is a plan view indicating the other embodiment 1 of the present invention.
Figure 9:
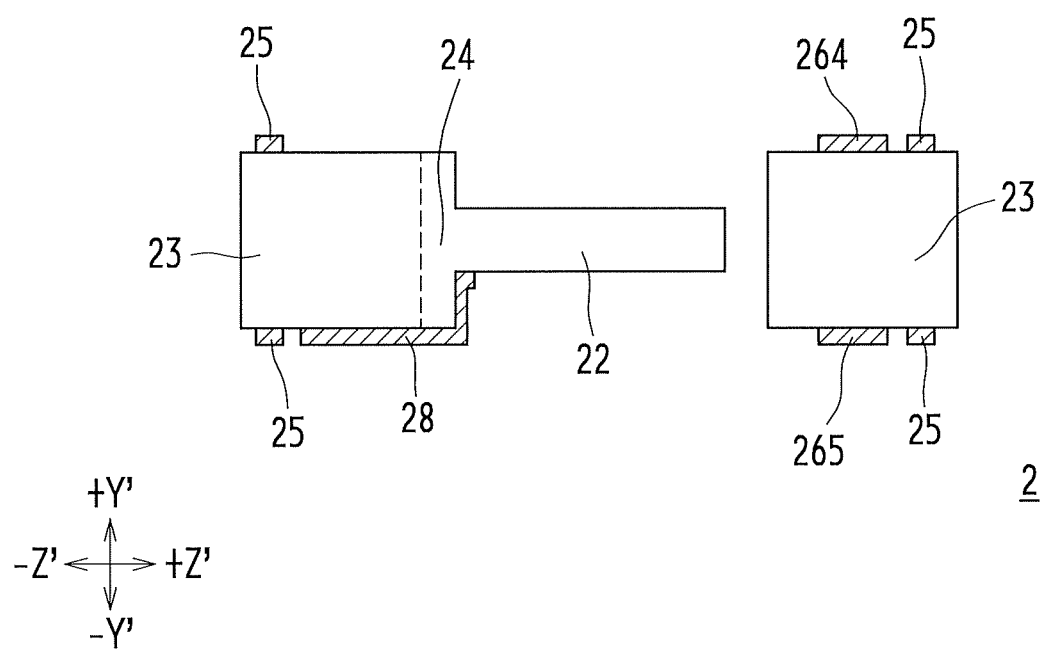
FIG. 9 is a cross-sectional view taken from line C-C of FIG. 8.

Also, as indicated in the other embodiment 1 shown in FIGS. 8 and 9, the connecting part 24 and the external frame part 23 may have the same thickness while only the vibrating part 22 is thinner than the above elements 24 and 23. With such a configuration, the natural frequency of piezoelectric vibration is different between the vibrating part 22 and the connecting part 24. Thus, the connecting part 24 is not likely to resonate with the piezoelectric vibration of the vibrating part 22. In addition, it is possible to enhance the rigidity of the joining portion of the connecting part 24 to the external frame part 23 as well as to relax concentration of strain stress applied to the connecting part 24 due to displacement of the vibrating part 22 caused by external impact.

In this embodiment, the connecting part 24 is provided at only one position between the vibrating part 22 and the external frame part 23 in the Z' axis direction. The connecting part 24 is extended from only one corner part 22a of the vibrating part 22 that is positioned in the +X direction and in the −Z' direction thereof (i.e. from one end part of the side of the vibrating part 22 along the X axis direction) to the external frame part 23 in the −Z' direction (i.e. the connecting part 24 is extended in the Z' axis direction). The remaining part between the vibrating part 22 and the external frame part 23 on which the connecting part 24 is not provided is made as a space (clearance) that serves as the cut-out part 21. Thus, the single connecting part 24 is disposed only on the corner part 22a (i.e. on one end part of the side of the vibrating part 22 along the X axis direction) where displacement of the piezoelectric vibration is relatively small in the outer peripheral edge of the vibrating part 22, such that the connecting part 24 is extended in the Z' axis direction.

That is, the connecting part 24 is not formed so as to be extended along the X axis direction that is an axis direction in which the vibration displacement distribution increases in the AT-cut vibrating part 22. In addition, in the vibrating part 22 having the rectangular shape in plan view, the vibration displacement is smallest at the corner part (at the end part of the side in the X axis direction). For this reason, the leakage of the piezoelectric vibration from the vibrating part 22 to the external frame part 23 via the connecting part 24 exerts less influence, which results in more efficient piezoelectric vibration of the vibrating part 22 of the crystal resonator plate 2. It is also possible to reduce stress applied to the vibrating part 22 compared to the case in which two or more connecting parts 24 are provided, which leads to reduction in frequency shift of the piezoelectric vibration caused by the stress. Therefore, it is possible to improve the stability of the piezoelectric vibration and to manufacture the crystal resonator plate 2 with the external frame part that is suitable for downsizing.

The present invention has the above-described characteristic feature that only one connecting part 24 is provided so as to be extended from the end part of the vibrating part 22 in the X axis direction toward the Z' axis direction. In addition to the above, the present invention also has a characteristic feature that a protruding part (expanded part) is formed on an inner peripheral edge of the external frame part 23 in the Z' axis direction, at least at the position adjacent to a corner part that is located diagonally with respect to the corner part of the vibrating part 22 to which is connected the connecting part 24 (i.e. adjacent to a free end of the vibrating part 22). Hereinafter, such an additional feature in this embodiment will be specifically described as shown in FIGS. 4 and 5.

A semicircular protruding part 23c is formed on an inner peripheral edge 231 of the external frame part 23 in the Z' axis direction such that the protruding part 23c is adjacent to a corner part 22c that is located diagonally with respect to the corner part 22a of the vibrating part 22 to which the connecting part 24 is connected. Also a protruding part 23b having the same shape as the protruding part 23c is formed on an inner peripheral edge 232 of the external frame part 23 that is opposite to the inner peripheral edge 231 in the X axis direction such that the protruding part 23b is adjacent to a corner part 22b of the vibrating part 22 and furthermore faces the protruding part 23c. That is, two semicircular protruding parts 23b and 23c are formed respectively on the inner peripheral edge 232 and the inner peripheral edge 231 of the external frame part 23 in the Z' axis direction so as to be adjacent, respectively, to the corner part 22c and the corner part 22b of the vibrating part 22. The semicircular protruding parts 23b and 23c are formed so as to be located symmetrically about a center line that passes through the center point of the external frame part 23 in the X axis direction so as to be in parallel with the Z' axis direction.

In this way, before the corner part 22c, which is a free end of the vibrating part 22, is excessively displaced in the X axis direction, the end part of the vibrating part 22 adjacent to the corner part 22c makes contact with and is supported by the protruding part 23c on the inner peripheral edge 231 of the external frame part 23 in the Z' axis direction. Also, the end part of the vibrating part 22 adjacent to the corner part 22b makes contact with and is supported by the protruding part 23b on the inner peripheral edge 232 of the external frame part 23 in the Z' axis direction. Thus, the vibrating part 22 of the crystal resonator plate 2 is prevented from largely bending in the plate surface direction, which contributes to protection of the connecting part 24 from breakage. Furthermore, since the protruding parts 23b and 23c are each provided only on a part of the corresponding inner peripheral edge of the external frame part 23 in the Z' axis direction, the effective area for the vibrating part 22 is not reduced, which prevents degradation of the electrical characteristics due to decrease of the vibration region in the result of downsizing of the crystal resonator plate 2.

Figure 10:
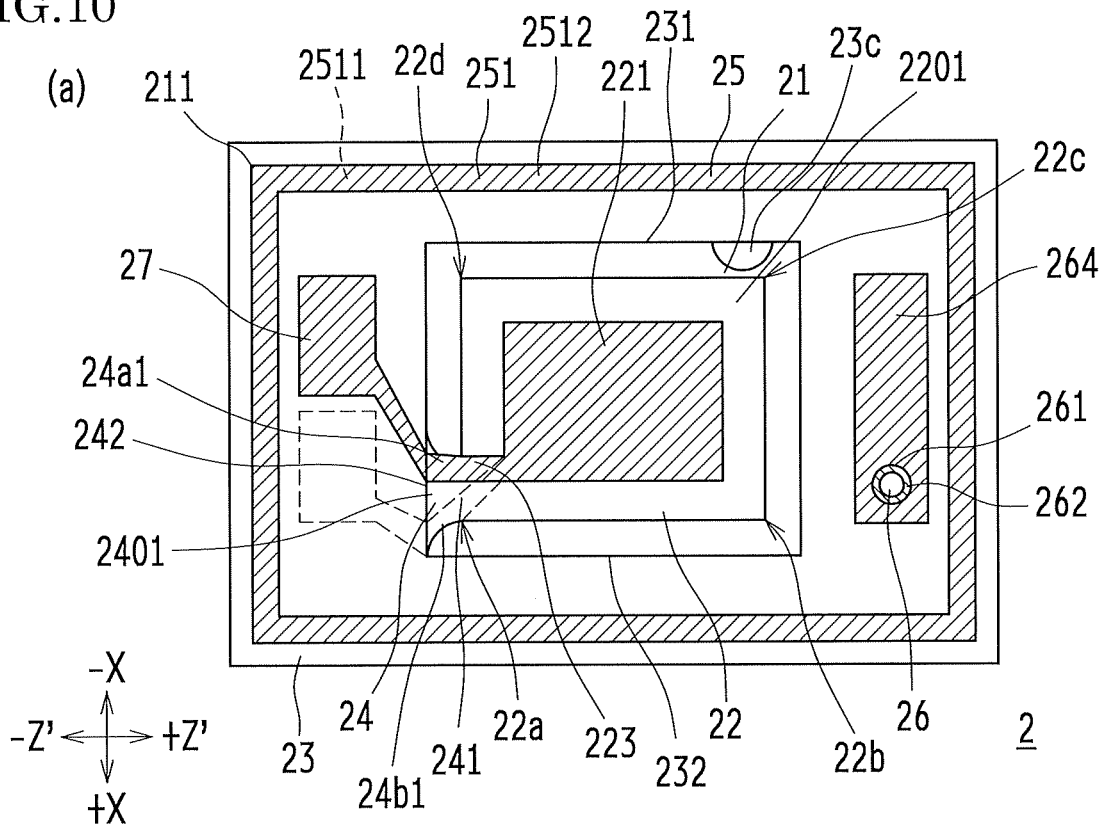
FIG. 10 are plan views respectively indicating the other embodiments 2 and 3 of the present invention.
Figure 10:
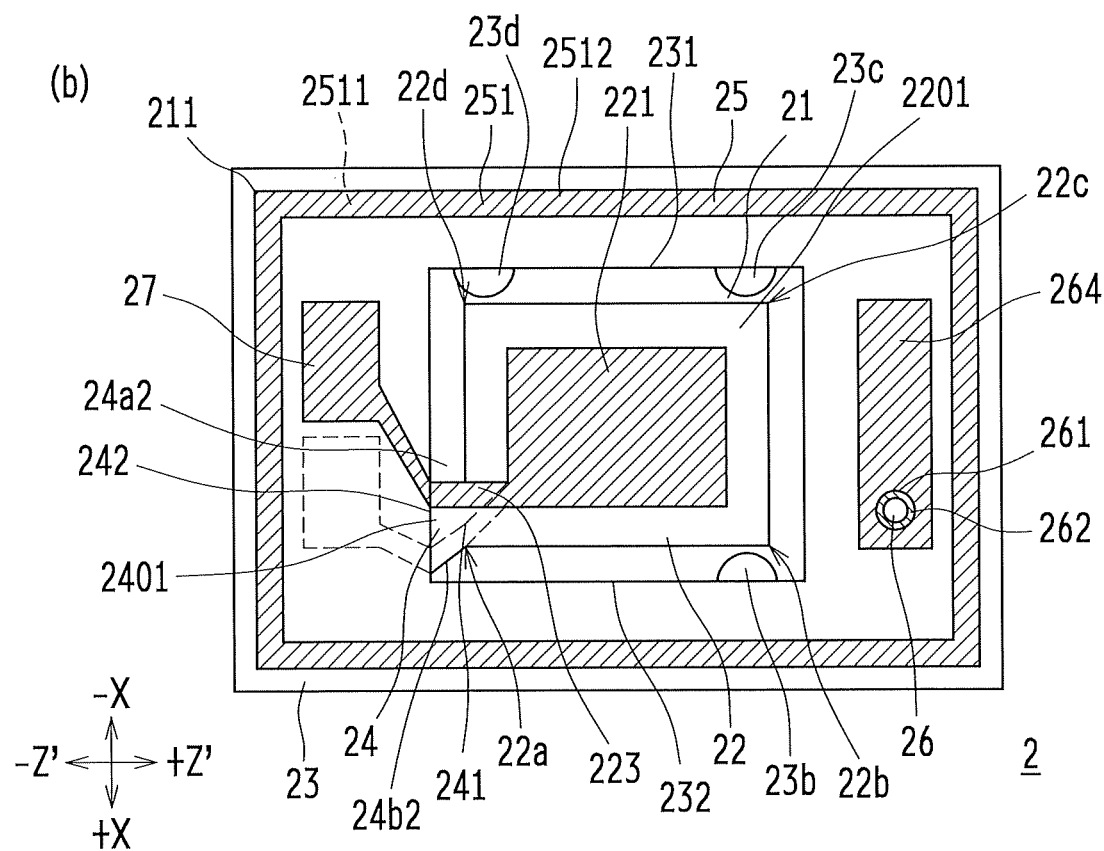

Also, the number of the protruding parts is not limited to that in this embodiment. As indicated in the other embodiment 2 shown in FIG. 10(a), the semicircular protruding part 23c may be formed on only one part of the inner peripheral edge 231 of the external frame part 23 in the Z' axis direction, at the position adjacent to the corner part 22c that is located diagonally with respect to the corner part 22a of the vibrating part 22 to which is connected the connecting part 24. Also, as indicated in the other embodiment 3 shown in FIG. 10(b), the semicircular protruding parts 23b, 23c and 23d may be formed respectively on three parts of the inner peripheral edge 231 and the inner peripheral edge 232 of the external frame part 23 in the Z' axis direction, at the positions respectively adjacent to all the corner parts 22b, 22c and 22d of the vibrating part 22 except for the corner part 22a to which is connected the connecting part 24.

The shape in plan view of the above protruding parts is not limited to the semicircular shape. The protruding part may have a curved shape such as an elliptical shape, or may have a polygonal shape such as a triangular shape or a rectangular shape. In addition, the respective protruding parts preferably have the same thickness as the external frame part 23 and the vibrating part 22 when they are manufactured in the manufacturing process, which is not, however, particularly limited thereto.

Figure 11:
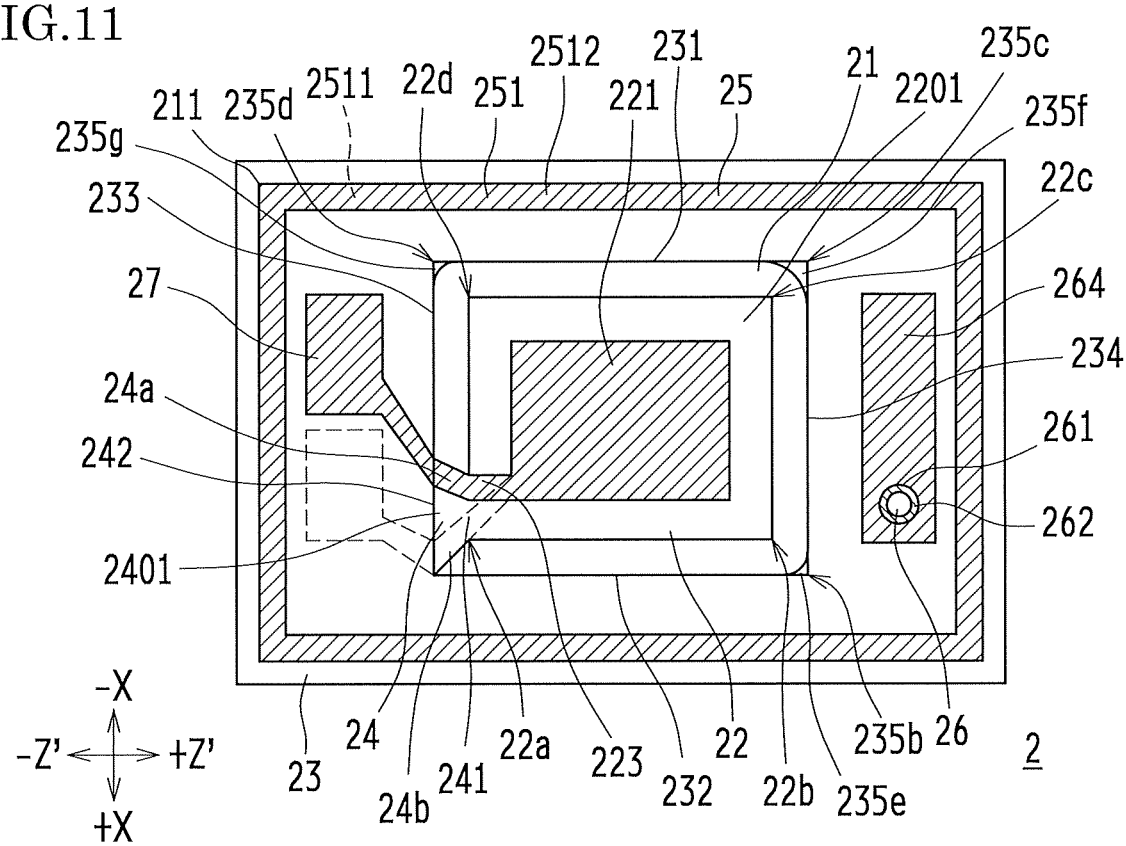
FIG. 11 is a plan view indicating the other embodiment 4 of the present invention.

Here, in place of providing the semicircular protruding part on the inner peripheral edge of the external frame part 23, an expanded part may be formed at a corner part of the inner peripheral edge of the external frame part 23, as indicated in the other embodiment 4 shown in FIG. 11.

As shown in FIG. 11, an expanded part 235f, which is expanded toward the cut-out part 21, is formed at a corner part 235c that is made by connecting, at a substantially right angle, the inner peripheral edge 231 along the Z' axis direction and an inner peripheral edge 234 along the X axis direction of the external frame part 23. The expanded part 235f is expanded toward the corner part 22c of the vibrating part 22, and located at a position diagonal to the connecting part 24 in plan view, with the center of the vibrating part 22 being interposed therebetween. The expanded part 235f is formed so as to have a substantially triangular shape, and its side surface has a shape curved to form a concave (a radius shape).

Also as shown in FIG. 11, an expanded part 235e, which is expanded toward the cut-out part 21, is formed at a corner part 235b that is made by connecting, at a substantially right angle, the inner peripheral edge 232 along the Z' axis direction and the inner peripheral edge 234 along the X axis direction of the external frame part 23. The expanded part 235e is formed so as to have a substantially triangular shape, and its side surface has a shape curved to form a concave (a radius shape), such that the expanded part 235e is expanded toward the corner part 22b of the vibrating part 22. Similarly to the above, an expanded part 235g, which is expanded toward the cut-out part 21, is formed at a corner part 235d that is made by connecting, at a substantially right angle, the inner peripheral edge 231 along the Z' axis direction and the inner peripheral edge 233 along the X axis direction of the external frame part 23. The expanded part 235g is formed so as to have a substantially triangular shape, and its side surface has a shape curved to form a concave (a radius shape), such that the expanded part 235g is expanded toward the corner part 22d of the vibrating part 22. The expanded part 235g is located at a position diagonal to the expanded part 235e in plan view, with the center of the vibrating part 22 being interposed therebetween.

Like this, the expanded parts 235e, 235f and 235g are respectively formed at the corner parts 235b, 235c and 235d on the inner peripheral edges of the external frame part 23. The expanded parts 235e, 235f and 235g can provide an effect similar to the above-described effect obtained by the protruding parts 23b, 23c and 23d. That is, the width of the cut-out part 21 reduces by the expanded parts 235e, 235f and 235g, which also means that the respective distances from the vibrating part 22 to the expanded parts 235e, 235f and 235g are small. Thus, the vibrating part 22 of the crystal resonator plate 2 is prevented from largely bending in the plate surface direction, which contributes to protection of the connecting part 24 from breakage. Furthermore, since the expanded parts 235e, 235f and 235g are each provided only on a part of the corresponding inner peripheral edge of the external frame part 23, the effective area for the vibrating part 22 is not reduced, which prevents degradation of the electrical characteristics due to decrease of the vibration region in the result of downsizing of the crystal resonator plate 2.

Also, as shown in FIG. 11, the expanded part 235f, which is located at the position diagonal to the connecting part 24, is larger than the expanded parts 235e and 235g that are not located diagonally with respect to the connecting part 24. For this reason, the distance between the vibrating part 22 and the expanded part 235f located at the position diagonal to the connecting part 24 is smaller than the respective distances between the vibrating part 22 and the expanded parts 235e and 235g that are not located diagonally with respect to the connecting part 24.

Here, when a fall or other external impact in the manufacturing process is applied to the crystal resonator plate 2, the most easily displacing part of the vibrating part 22 of the crystal resonator plate 2 is a free end of the vibrating part, i.e. the corner part 22c of the vibrating part 22 that is located diagonally with respect to the corner part 22a of the vibrating part 22 to which is connected the connecting part 24. Since the connecting part 24 is extended along the Z' axis direction, the free end of the vibrating part 22 is likely to excessively displace especially in the X axis direction in the plate surface direction (i.e. in the X axis direction and the Z' axis direction). In this configuration, the expanded part 235f is formed at a position diagonal to the connecting part 24 in plan view with the center of the vibrating part 22 being interposed therebetween, so that the expanded part 235f is expanded from the inner peripheral edge of the external frame part 23 toward the cut-out part 21. Furthermore, the expanded part 235f is formed larger than the expanded parts 235e and 235g that are not located diagonally with respect to the connecting part 24. Thus, the end part of the vibrating part 22 in the vicinity of the free end thereof makes contact with and is supported by the expanded part 235f of the external frame part 23 before the free end of the vibrating part 22 is excessively displaced in the X axis direction. Therefore, the vibrating part 22 of the crystal resonator plate 2 is prevented from largely bending in the plate surface direction, which contributes to protection of the connecting part 24 from breakage. Furthermore, since the vibrating part 22 is not provided with the expanded part but the external frame part 23 is provided with the expanded part 235f, negative influence on the piezoelectric vibration characteristics such as changes in the vibration displacement area or a spurious emission, which may be caused by the expanded part on the vibrating part 22, does not occur. Thus, with the above configuration, the rigidity of the external frame part 23 is enhanced, which leads to improvement of the impact resistance.

Figure 12:
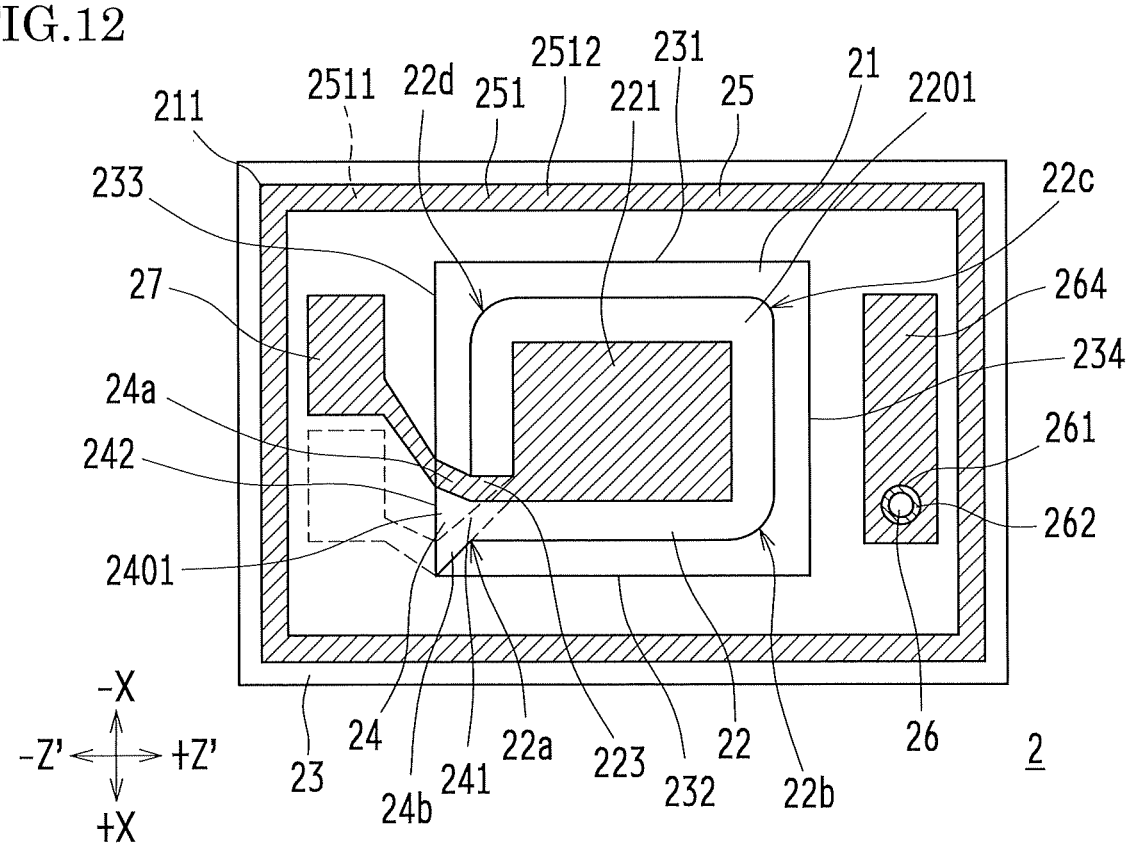
FIG. 12 is a plan view indicating the other embodiment 5 of the present invention.

As indicated in the other embodiment 5 shown in FIG. 12, the corner parts 22b, 22c and 22d of the vibrating part 22 are in some cases each formed in a shape curved to form a convex (a radius shape), not in a square shape. That is, each apex of the corner parts 22b, 22c and 22d of the vibrating part 22 is trimmed to form a convex, which increases the width of the cut-out part 21. In this case, as shown in FIG. 12, it is preferable that the corner part 22c located diagonally with respect to the connecting part 24 is trimmed less largely than the trimming of the corner parts 22b and 22d that are not located diagonally with respect to the connecting part 24. In this way, the distance from the corner part 22c located diagonally with respect to the connecting part 24 to the external frame part 23 can be set smaller than the respective distances from the respective corner parts 22b and 22d not located diagonally with respect to the connecting part 24 to the external frame part 23. Thus, it is possible to obtain an effect similar to the case in which the above-described protruding part 23c (see FIG. 4) or the expanded part 235f (see FIG. 11) is provided on the external frame part 23.

The present invention has the above-described characteristic feature that only one connecting part 24 is provided so as to be extended from the end part of the vibrating part 22 in the X axis direction toward the Z' axis direction. In addition to the above, the present invention also has a characteristic feature that a wide part 24b (a first wide part in the present invention) is formed on the side surface of the connecting part 24 on the +X axis side such that the width (in the X axis direction) of the wide part 24b gradually increases from the vibrating part 22 only toward the external frame part 23. Hereinafter, such an additional feature in this embodiment will be specifically described as shown in FIGS. 4 and 5.

The connecting part 24 in this embodiment is provided with a wide part 24a (a second wide part in the present invention) and the wide part 24b (the first wide part in the present invention) respectively formed on the side surface on the −X axis side and on the side surface on the +X axis side of the connecting part 24. Each wide part is formed so as to have a substantially V shape in plan view that gradually and linearly spreads in only one direction, across from an end part 241 that makes contact with the vibrating part 22 to an end part 242 that makes contact with the external frame part 23. Also, the wide part 24b has a large spread angle in the Z' axis direction and thus has a large area compared to the wide part 24a. That is, the wide part 24a and the wide part 24b respectively have the shapes asymmetric to each other.

Thus, it is possible to enhance the rigidity of the joining portion on the fixed end side of the connecting part 24 to the external frame part 23, and further to disperse the strain stress, which is applied to the connecting part 24 due to the displacement of the vibrating part 22 of the crystal resonator plate 2 by external impact, into the external frame part 23. Also, it is possible to reduce influence caused by vibration leakage from the vibrating part 22 to the external frame part 23 as described above, compared to the case in which the entire connecting part 24 is formed to have a large width.

Furthermore, since the wide part 24a and the wide part 24b are formed so as to have the shapes asymmetric to each other, the stress balance between the side surface on the −X axis side and the side surface on the +X axis side of the connecting part 24 can be changed, which leads to relaxing the strain stress concentration applied to the joining portion joining the connecting part 24 to the external frame part 23.

The shape of the wide part is not limited to that in this embodiment. As indicated in the other embodiment 2 shown in FIG. 10(a), a wide part 24a1 may be formed so as to have a curved shape with its width gradually increasing from the center of the connecting part 24 toward one side of the direction from the connecting points of the connecting part 24 to the end part 241 of the vibrating part 22 to the connecting points of the connecting part 24 to the end part 242 of the external frame part 23. A wide part 24b1 may be formed so as to have a curved shape with its width gradually increasing in only one direction from the end part 241 that makes contact with the vibrating part 22 toward the end part 242 that makes contact with the external frame part 23. Furthermore, as indicated the other embodiment 3 shown in FIG. 10(b), a wide part 24b2 may be formed on the side surface of the connecting part 24 on the +X axis side such that its width gradually and linearly increases in only one direction from the end part 241 that makes contact with the vibrating part 22 toward the end part 242 that makes contact with the external frame part 23. In this way, the wide part of this embodiment may be formed across all over the connecting part 24 (i.e. over the entire part from the end part 241 that makes contact with the vibrating part 22 to the end part 242 that makes contact with the external frame part 23), or may be formed only on one part of the connecting part 24 as indicated in the other embodiment 6 shown in FIG. 13. Regarding the shape of the wide part, it may have a curved shape or a linear shape, or a shape created by combining these shapes.

Figure 13:
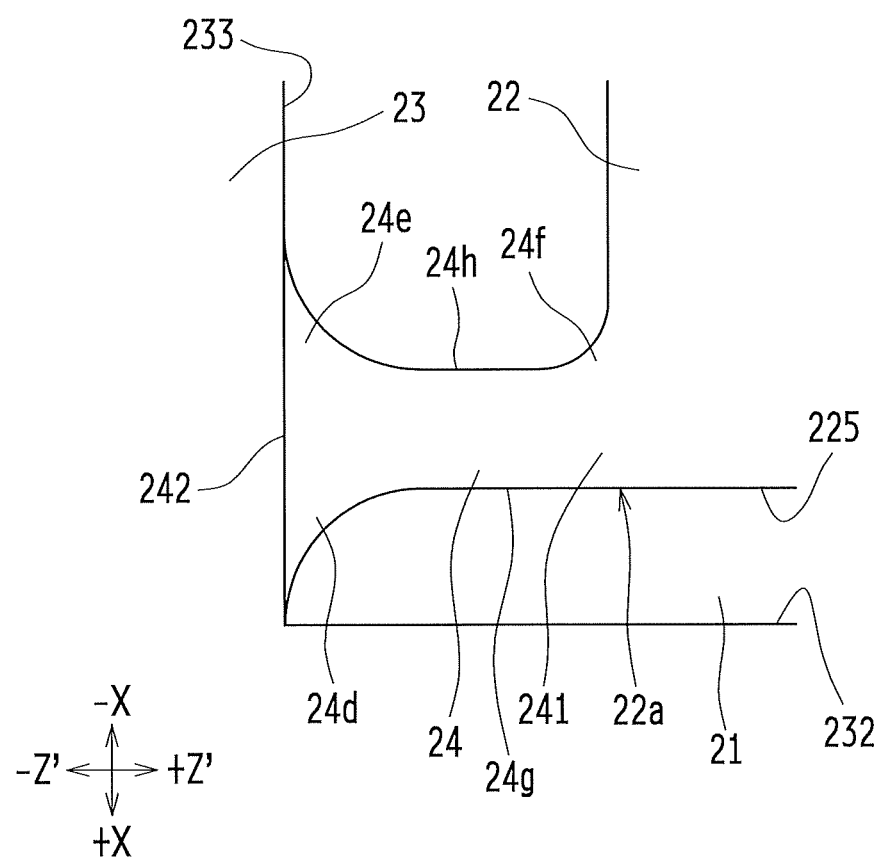
FIG. 13 is a plan view indicating the other embodiment 6 of the present invention, which shows an enlarged main part of the crystal resonator plate.

As indicated in the other embodiment 6 shown in FIG. 13, a first wide part 24d on the side surface of the connecting part 24 on the +X axis side and a second wide part 24e on the side surface of the connecting part 24 on the −X axis side are each formed only on one part of the connecting part 24, not formed over the entire of the connecting part 24. Note that the elements such as the first excitation electrode 221 and the first extraction electrode 223 are omitted from FIG. 13.

Specifically, as shown in FIG. 13, the first wide part 24d and the second wide part 24e are disposed on the connecting part 24 on the side of the external frame part 23 (i.e. on the −Z' axis side), and not disposed on the connecting part 24 on the side of the vibrating part 22 (i.e. on the +Z' axis side). The first wide part 24d and the second wide part 24e are each formed so as to have a substantially triangular shape with its side surface being curved to form a concave (a radius shape).

In addition to the first wide part 24d and the second wide part 24e, a third wide part 24f is formed on the connecting part 24 on the side of the vibrating part 22 (i.e. on the +Z' axis side). Unlike the first wide part 24d and the second wide part 24e, the third wide part 24f is formed such that the width thereof gradually decreases from the vibrating part 22 toward the external frame part 23. The third wide part 24f is formed so as to have a substantially triangular shape with its side surface being curved to form a concave (a radius shape).

The third wide part 24f is formed on the side surface of the connecting part 24 on the −X axis side. That is, on the side surface of the connecting part 24 on the −X axis side, the second wide part 24e and the third wide part 24f are provided. In the example shown in FIG. 13, a part 24h is provided so as to extend in parallel with the Z' axis direction between the second wide part 24e and the third wide part 24f. In contrast to the above, only the first wide part 24d is formed on the side surface of the connecting part 24 on the −X axis side, and a part (part on the +Z' axis side) 24g of the connecting part 24 on the side of the vibrating part 22 is provided so as to extend in parallel with the Z' axis direction. The side surface of the part 24g on the +X axis side linearly extends from a side 225 of the vibrating part 22 that extends along the Z' axis direction. In the example shown in FIG. 13, the first wide part 24d and the second wide part 24e are disposed on the −Z' axis side with respect to the center position of the connecting part 24 in the Z' axis direction while the third wide part 24f is disposed on the +Z' axis side with respect to the center position. However, the present invention is not limited thereto. The first wide part 24d and the second wide part 24e may be formed so as to exceed the center position of the connecting part 24 in the Z' axis direction.

As described above, the third wide part 24f is provided on the connecting part 24 in addition to the first wide part 24d and the second wide part 24e. Thus, it is possible to enhance the rigidity of the joining portion (i.e. the end part 242) of the connecting part 24 to the external frame part 23 by the first wide part 24d and the second wide part 24e as well as to enhance the rigidity of the joining portion (i.e. the end part 241) of the connecting part 24 to the vibrating part 22 by the third wide part 24f.

Also as shown in FIG. 13, the third wide part 24f is formed smaller than the first wide part 24d and the second wide part 24e in plan view. Thus, negative influence on the piezoelectric vibration characteristics such as a spurious emission can be reduced while preventing influence of vibration leakage from the vibrating part 22 to the external frame part 23 via the connecting part 24.

In the crystal resonator plate 2, the first extraction electrode 223 is drawn from the first excitation electrode 221 and connected to a connection bonding pattern 27 formed on the external frame part 23 via the connecting part 24. The second extraction electrode 224 is drawn from the second excitation electrode 222 and connected to a connection bonding pattern 28 formed on the external frame part 23 via the connecting part 24.

The first excitation electrode 221 is constituted of a base PVD film deposited on a first main surface 2201 of the vibrating part 22 by physical vapor deposition, and an electrode PVD film deposited on the base PVD film by the physical vapor deposition. The extraction electrode 223 is constituted of a base PVD film deposited on a part of a first main surface 2401 and on a part of one side surface of the connecting part 24 by the physical vapor deposition, and an electrode PVD film deposited on the base PVD film by the physical vapor deposition. The second excitation electrode 222 is constituted of a base PVD film deposited on a second main surface 2202 of the vibrating part 22 by the physical vapor deposition, and an electrode PVD film deposited on the base PVD film by the physical vapor deposition. The second extraction electrode 224 is constituted of a base PVD film deposited on a part of a second main surface 2402 and on a part of the other side surface of the connecting part 24 by the physical vapor deposition, and an electrode PVD film deposited on the base PVD film by the physical vapor deposition.

Resonator-plate-side sealing parts 25 for bonding the crystal resonator plate 2 respectively to the first sealing member 3 and the second sealing member 4 are provided on the respective main surfaces 211 and 212 of the crystal resonator plate 2. On the resonator-plate-side sealing part 25 on the first main surface 211 of the crystal resonator plate 2, a resonator-plate-side first bonding pattern 251 is formed so as to be bonded to the first sealing member 3. Also, on the resonator-plate-side sealing part 25 on the second main surface 212 of the crystal resonator plate 2, a resonator-plate-side second bonding pattern 252 is formed so as to be bonded to the second sealing member 4. The resonator-plate-side first bonding pattern 251 and the resonator-plate-side second bonding pattern 252 are each formed on the external frame part 23 so as to have an annular shape in plan view. The resonator-plate-side first bonding pattern 251 and the resonator-plate-side second bonding pattern 252 are disposed on the respective main surfaces 211 and 212 of the crystal resonator plate 2 so as to be close to the outer peripheral edge of the main surfaces 211 and 212. The pair of first excitation electrode 221 and second excitation electrode 222 of the crystal resonator plate 2 is not electrically connected to the resonator-plate-side first bonding pattern 251 and the resonator-plate-side second bonding pattern 252.

The resonator-plate-side first bonding pattern 251 is constituted of a base PVD film 2511 deposited on the first main surface 211 by the physical vapor deposition, and an electrode PVD film 2512 deposited on the base PVD film 2511 by the physical vapor deposition. The resonator-plate-side second bonding pattern 252 is constituted of a base PVD film 2521 deposited on the second main surface 212 by the physical vapor deposition, and an electrode PVD film 2522 deposited on the base PVD film 2521 by the physical vapor deposition. That is, the resonator-plate-side first bonding pattern 251 and the resonator-plate-side second bonding pattern 252 have the same configuration in which a plurality of layers is laminated on the resonator-plate-side sealing part 25 of each main surface 211 and 212, specifically, a Ti layer (or a Cr layer) and an Au layer are deposited by vapor deposition in this order from the lowermost layer side. Like this, in the resonator-plate-side first bonding pattern 251 and the resonator-plate-side second bonding pattern 252, the base PVD films 2511 and 2521 are made of a single material (Ti or Cr), the electrode PVD films 2512 and 2522 are made of a single material (Au), and the electrode PVD films 2512 and 2522 have a thickness greater than the thickness of the base PVD films 2511 and 2521. The first excitation electrode 221 and the resonator-plate-side first bonding pattern 251 both formed on the first main surface 211 of the crystal resonator plate 2 have the same thickness, and the surfaces of the first excitation electrode 221 and the resonator-plate-side first bonding pattern 251 are made of the same metal. The second excitation electrode 222 and the resonator-plate-side second bonding pattern 252 both formed on the second main surface 212 of the crystal resonator plate 2 have the same thickness, and the surfaces of the second excitation electrode 222 and the resonator-plate-side second bonding pattern 252 are made of the same metal. The resonator-plate-side first bonding pattern 251 and the resonator-plate-side second bonding pattern 252 do not contain Sn.

Here, the first excitation electrode 221, the first extraction electrode 223 and the resonator-plate-side first bonding pattern 251 can have the same configuration. In this case, it is possible to form collectively the first excitation electrode 221, the first extraction electrode 223 and the resonator-plate-side first bonding pattern 251 in the same process. Similarly to the above, the second excitation electrode 222, the second extraction electrode 224 and the resonator-plate-side second bonding pattern 252 can have the same configuration. In this case, it is possible to form collectively the second excitation electrode 222, the second extraction electrode 224 and the resonator-plate-side second bonding pattern 252 in the same process. More specifically, the base PVD films and the electrode PVD films are formed using a PVD method (for example, a film forming method for patterning in processing such as photolithography) such as vacuum deposition, sputtering, ion plating, molecular beam epitaxy (MBE) and laser ablation. Thus, it is possible to form the films collectively, which leads to reduction in producing processes and in cost.

Also, as shown in FIGS. 4 and 5, a through hole (a first through hole 26) is formed in the crystal resonator plate 2 so as to penetrate between the first main surface 211 and the second main surface 212. The first through hole 26 is disposed in the external frame part 23 of the crystal resonator plate 2. The first through hole 26 is connected to a connection bonding pattern 453 of the second sealing member 4 described later.

In the first through hole 26, a through electrode 261 is formed along an inner wall surface of the first through hole 26 so as to establish conduction between electrodes formed on the first main surface 211 and the second main surface 212, as shown in FIGS. 1, 4 and 5. A center part of the first through hole 26 is a hollow through part 262 penetrating between the first main surface 211 and the second main surface 212. Connection bonding patterns 264 and 265 are formed on respective outer peripheries of the first through hole 26. The connection bonding patterns 264 and 265 are formed respectively on the main surfaces 211 and 212 of the crystal resonator plate 2.

The connection bonding pattern 264 of the first through hole 26 formed on the first main surface 211 of the crystal resonator plate 2 extends on the external frame part 23 in the X axis direction. The connection bonding pattern 27 is formed on the first main surface 211 of the crystal resonator plate 2 so as to be connected to the first extraction electrode 223. The connection bonding pattern 27 also extends on the external frame part 23 in the X axis direction. The connection bonding pattern 27 is formed on the side opposite to the connection bonding pattern 264 in the Z' axis direction with the vibrating part 22 (the first excitation electrode 221) being interposed therebetween. That is, the connection bonding patterns 27 and 264 are formed respectively on both sides of the vibrating part 22 in the Z' axis direction.

Similarly to the above, the connection bonding pattern 265 of the first through hole 26 formed on the second main surface 212 of the crystal resonator plate 2 extends on the external frame part 23 in the X axis direction. The connection bonding pattern 28 is formed on the second main surface 212 of the crystal resonator plate 2 so as to be connected to the second extraction electrode 224. The connection bonding pattern 28 also extends on the external frame part 23 in the X axis direction. The connection bonding pattern 28 is formed on the side opposite to the connection bonding pattern 265 in the Z' axis direction with the vibrating part 22 (the second excitation electrode 222) being interposed therebetween. That is, the connection bonding patterns 28 and 265 are formed respectively on both sides of the vibrating part 22 in the Z' axis direction.

The connection bonding patterns 27, 28, 264 and 265 have the same configuration as the resonator-plate-side first bonding pattern 251 and the resonator-plate-side second bonding pattern 252, accordingly, they can be formed by the same process as that for the resonator-plate-side first bonding pattern 251 and the resonator-plate-side second bonding pattern 252. Specifically, each connection bonding pattern 27, 28, 264 and 265 is constituted of a base PVD film deposited on each main surface (the first main surface 211 and the second main surface 212) of the crystal resonator plate 2 by the physical vapor deposition, and an electrode PVD film deposited on the base PVD film by the physical vapor deposition.

In the crystal resonator 101, the first through hole 26 and the connection bonding patterns 27, 28, 264 and 265 are formed in the inward position of the internal space 13 (inside of respective inner peripheral surfaces of bonding materials 11) in plan view. The internal space 13 is formed in the inward position (inside) of the resonator-plate-side first bonding pattern 251 and the resonator-plate-side second bonding pattern 252 in plan view. Here, the inward position of the internal space 13 means strictly the inner side of the respective inner peripheral surfaces of the bonding materials 11 (described later), not including the positions on the bonding materials 11. The first through hole 26 and the connection bonding patterns 27, 28, 264 and 265 are not electrically connected to the resonator-plate-side first bonding pattern 251 and the resonator-plate-side second bonding pattern 252.

Figure 2:
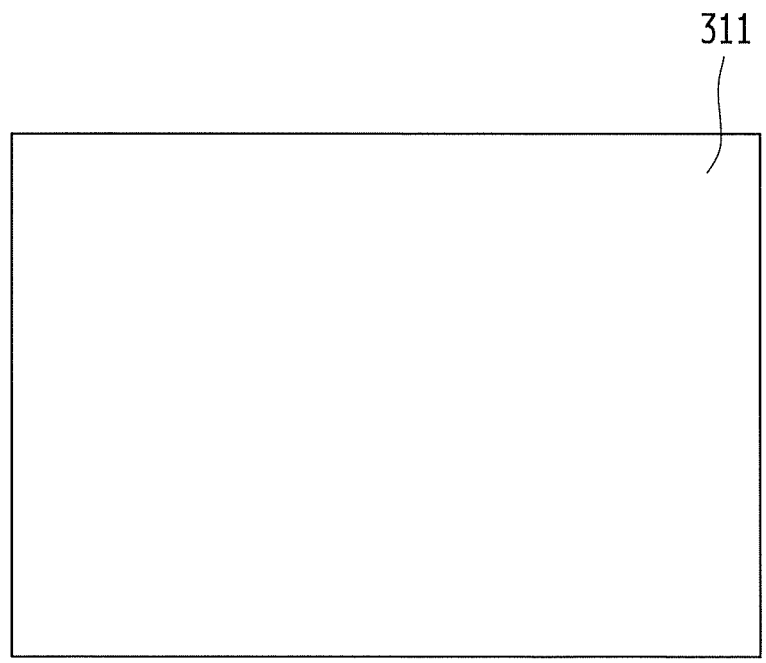
FIG. 2 is a schematic plan view illustrating a first sealing member of the crystal resonator.
Figure 3:
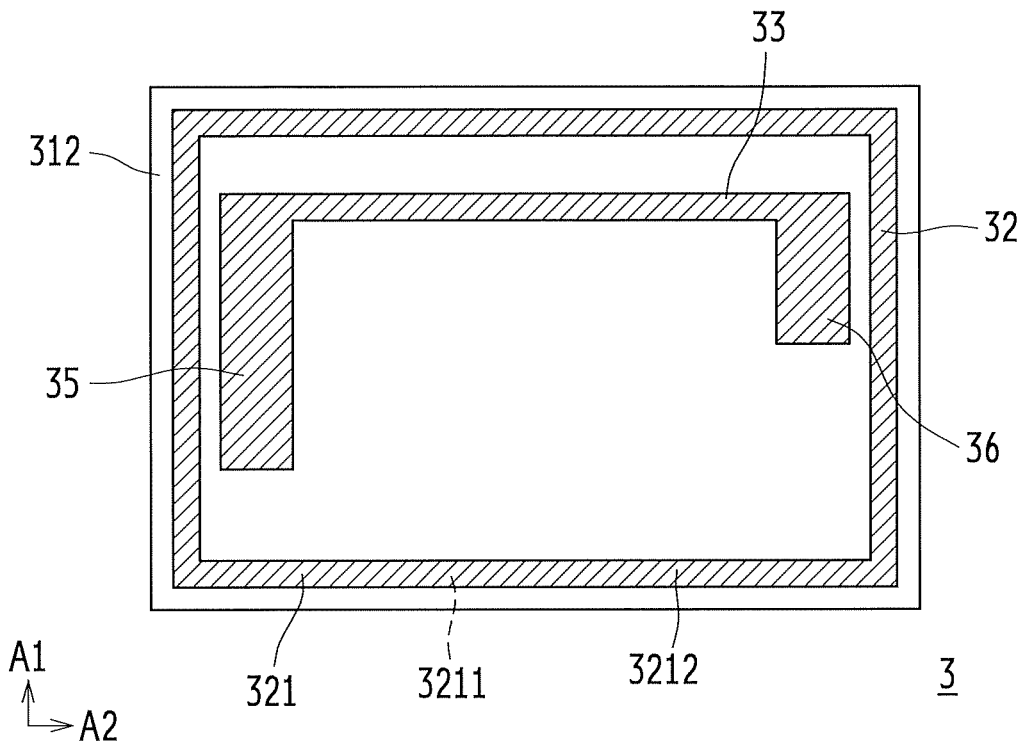
FIG. 3 is a schematic rear view illustrating the first sealing member of the crystal resonator.

The first sealing member 3 is made of a material having the flexural rigidity (moment of inertia of area×Young's modulus) of not more than 1000 [N·mm$^2$]. Specifically, as shown in FIGS. 2 and 3, the first sealing member 3 is a substrate having a rectangular parallelepiped shape that is made of a single glass wafer. A second main surface 312 (a surface to be bonded to the crystal resonator plate 2) of the first sealing member 3 is formed as a smooth flat surface (mirror finished).

On the second main surface 312 of the first sealing member 3, a sealing-member-side first sealing part 32 is disposed so as to be bonded to the crystal resonator plate 2. A sealing-member-side first bonding pattern 321 is formed on the sealing-member side first sealing part 32 so as to be bonded to the crystal resonator plate 2. The sealing-member-side first bonding pattern 321 is formed so as to have an annular shape in plan view. The sealing-member-side first bonding pattern 321 is disposed so as to be close to the outer peripheral edge of the second main surface 312 of the first sealing member 3. The sealing-member-side first bonding pattern 321 has the same width at all positions on the sealing-member-side first sealing part 32 of the first sealing member 3.

The sealing-member-side first bonding pattern 321 is constituted of a base PVD film 3211 deposited on the first sealing member 3 by the physical vapor deposition, and an electrode PVD film 3212 deposited on the base PVD film 3211 by the physical vapor deposition. In this embodiment, the base PVD film 3211 is made of Ti (or Cr), and the electrode PVD film 3212 is made of Au. Also, the sealing-member-side first bonding pattern 321 does not contain Sn. Specifically, the sealing-member-side first bonding pattern 321 is made of a plurality of layers laminated on the sealing-member-side first sealing part 32 of the second main surface 312, that is, a Ti layer (or a Cr layer) and an Au layer are deposited by the vapor deposition in this order from the lowermost layer side.

On the second main surface 312 (i.e. the surface facing the crystal resonator plate 2) of the sealing member 3, connection bonding patterns 35 and 36 are formed so as to be bonded, respectively, to the connection bonding patterns 264 and 27 of the crystal resonator plate 2. The connection bonding patterns 35 and 36 extend in the short side direction (in the A1 direction in FIG. 3) of the first sealing member 3. The connection bonding patterns 35 and 36 are provided at a predetermined interval in the long side direction (in the A2 direction in FIG. 3) of the first sealing member 3. The interval between the connection bonding patterns 35 and 36 in the A2 direction is substantially the same as the interval between the connection bonding patterns 264 and 27 in the Z' direction of the crystal resonator plate 2 (see FIG. 4). The connection bonding patterns 35 and 36 are connected to each other via a wiring pattern 33. The wiring pattern 33 is disposed between the connection bonding patterns 35 and 36. The wiring pattern 33 extends in the A2 direction. The wiring pattern 33 is not bonded to the connection bonding patterns 264 and 27 of the crystal resonator plate 2.

The connection bonding patterns 35 and 36, and the wiring pattern 33 have the same configuration as the sealing-member-side first bonding pattern 321, accordingly, they can be formed by the same process as that for the sealing-member-side first bonding pattern 321. Specifically, each of the connection bonding patterns 35 and 36 and the wiring pattern 33 is constituted of a base PVD film deposited on the second main surface 312 of the first sealing member 3 by the physical vapor deposition, and an electrode PVD film deposited on the base PVD film by the physical vapor deposition.

In the crystal resonator 101, the connection bonding patterns 35 and 36, and the wiring pattern 33 are formed in the inward position of the internal space 13 (inside of the respective inner peripheral surfaces of the bonding materials 11) in plan view. The connection bonding patterns 35 and 36, and the wiring pattern 33 are not electrically connected to the sealing-member-side first bonding pattern 321. In the crystal resonator 101, the A1 direction in FIG. 3 equals the X axis direction in FIG. 4, and the A2 direction in FIG. 3 equals the Z' axis direction in FIG. 4.

Figure 6:
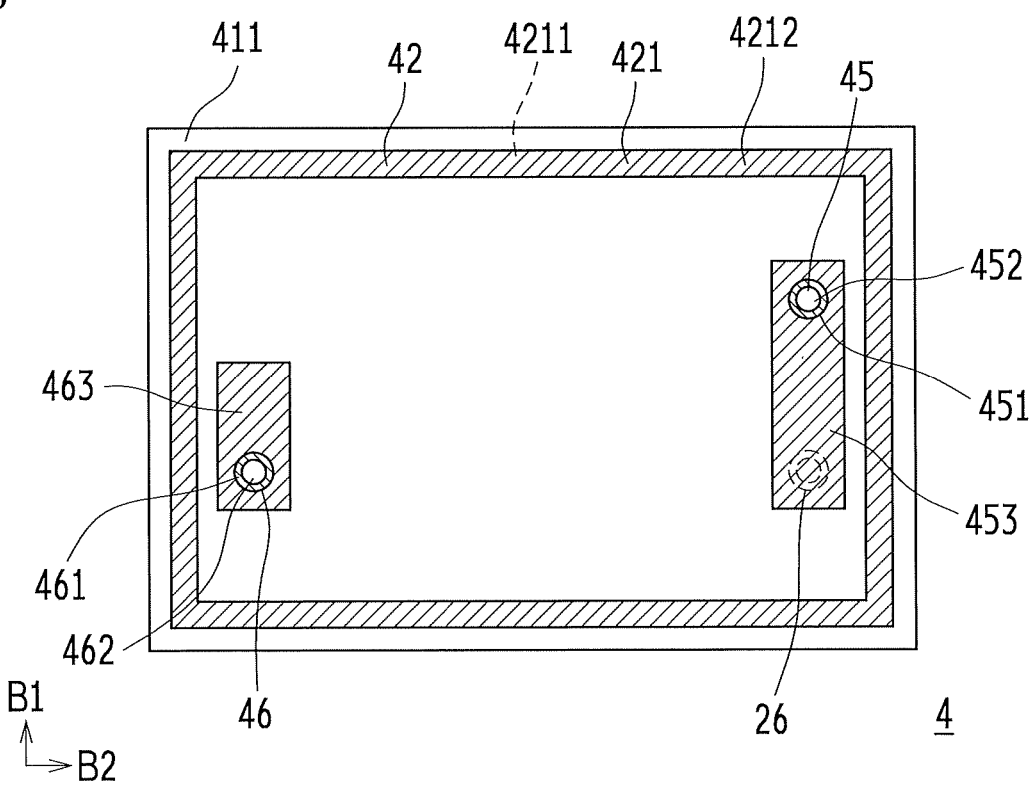
FIG. 6 is a schematic plan view illustrating a second sealing member of the crystal resonator.
Figure 7:
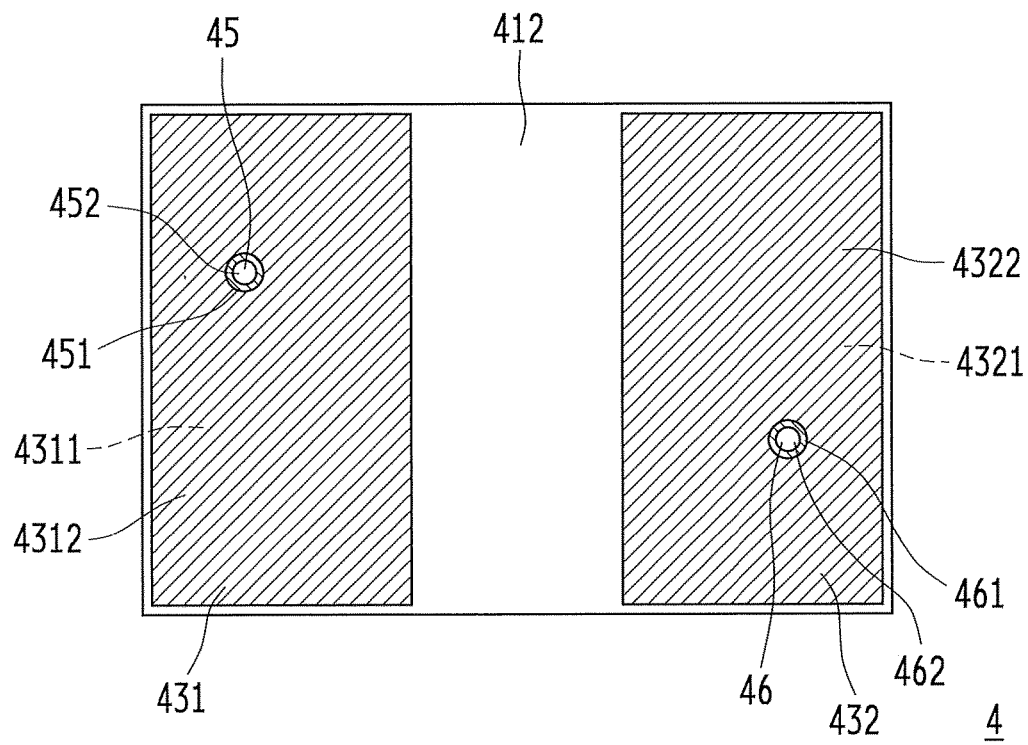
FIG. 7 is a schematic rear view illustrating the second sealing member of the crystal resonator.

The second sealing member 4 is made of a material having the flexural rigidity (moment of inertia of area× Young's modulus) of not more than 1000 [N·mm$^2$]. Specifically, as shown in FIGS. 6 and 7, the second sealing member 4 is a substrate having a rectangular parallelepiped shape that is made of a single glass wafer. A first main surface 411 (a surface to be bonded to the crystal resonator plate 2) of the second sealing member 4 is formed as a smooth flat surface (mirror finished).

On the first main surface 411 of the second sealing member 4, a sealing-member-side second sealing part 42 is disposed so as to be bonded to the crystal resonator plate 2. On the sealing-member-side second sealing part 42, a sealing-member-side second bonding pattern 421 is formed so as to be bonded to the crystal resonator plate 2. The sealing-member-side second bonding pattern 421 is formed so as to have an annular shape in plan view. The sealing-member-side second bonding pattern 421 is disposed so as to be close to the outer peripheral edge of the first main surface 411 of the second sealing member 4. The sealing-member-side second bonding pattern 421 has the same width at all positions on the sealing-member-side second sealing part 42 of the second sealing member 4.

The sealing-member-side second bonding pattern 421 is constituted of a base PVD film 4211 deposited on the second sealing member 4 by the physical vapor deposition, and an electrode PVD film 4212 deposited on the base PVD film 4211 by the physical vapor deposition. In this embodiment, the base PVD film 4211 is made of Ti (or Cr), and the electrode PVD film 4212 is made of Au. Also, the sealing-member-side second bonding pattern 421 does not contain Sn. Specifically, the sealing-member-side second bonding pattern 421 is made of a plurality of layers laminated on the sealing-member-side second sealing part 42 of the second main surface 412, that is, a Ti layer (or a Cr layer) and an Au layer are deposited by the vapor deposition in this order from the lowermost layer side.

Also, a pair of external electrode terminals (the first external electrode terminal 431 and the second external electrode terminal 432), which is electrically connected to the outside, is formed on the second main surface 412 (the outer main surface not facing the crystal resonator plate 2) of the second sealing member 4. As shown in FIGS. 1 and 7, the first external electrode terminal 431 and the second external electrode terminal 432 are located at respective end parts of the second main surface 412 of the second sealing member 4 in the longitudinal direction in plan view. The pair of external electrode terminals (the first external electrode terminal 431 and the second external electrode terminal 432) is constituted of base PVD films 4311 and 4321 deposited on the second main surface 412 by the physical vapor deposition, and electrode PVD films 4312 and 4322 respectively deposited on the base PVD films 4311 and 4321 by the physical vapor deposition. The first external electrode terminal 431 and the second external electrode terminal 432 each cover a region not less than ⅓ of the area of the second main surface 412 of the second sealing member 4.

As shown in FIGS. 1, 6 and 7, two through holes (a second through hole 45 and a third through hole 46) are formed in the second sealing member 4 so as to penetrate between the first main surface 411 and the second main surface 412. The second through hole 45 is connected to the first external electrode terminal 431 and to the connection bonding pattern 265 of the crystal resonator plate 2. The third through hole 46 is connected to the second external electrode terminal 432 and to the connection bonding pattern 28 of the crystal resonator plate 2.

In the second through hole 45 and the third through hole 46, through electrodes 451 and 461 are respectively formed along inner wall surfaces of the second through hole 45 and the third through hole 46 so as to establish conduction between electrodes formed on the first main surface 411 and the second main surface 412, as shown in FIGS. 1, 6 and 7. Respective center parts of the second through hole 45 and the third through hole 46 are hollow through parts 452 and 462 penetrating between the first main surface 411 and the second main surface 412. Connection bonding patterns 453 and 463 are formed respectively on the outer peripheries of the second through hole 45 and the third through hole 46.

The connection bonding patterns 453 and 463 are provided on the first main surface 411 of the second sealing member 4 so as to be bonded, respectively, to the connection bonding patterns 265 and 28 of the crystal resonator plate 2. The connection bonding patterns 453 and 463 extend in the short side direction (in the B1 direction in FIG. 6) of the second sealing member 4. The connection bonding patterns 453 and 463 are provided at a predetermined interval in the long side direction (in the B2 direction in FIG. 6) of the second sealing member 4. The interval between the connection bonding patterns 453 and 463 in the B2 direction is substantially the same as the interval between the connection bonding patterns 265 and 28 in the Z' axis direction of the crystal resonator plate 2 (see FIG. 5).

The connection bonding patterns 453 and 463 have the same configuration as the sealing-member-side second bonding pattern 421, accordingly, they can be formed by the same process as that for the sealing-member-side second bonding pattern 421. Specifically, each of the connection bonding patterns 453 and 463 is constituted of a base PVD film deposited on the first main surface 411 of the second sealing member 4 by the physical vapor deposition, and an electrode PVD film deposited on the base PVD film by the physical vapor deposition.

In the crystal resonator 101, the second through hole 45, the third through hole 46, and the connection bonding patterns 453 and 463 are formed in the inward position of the internal space 13 in plan view. The second through hole 45, the third through hole 46, and the connection bonding patterns 453 and 463 are not electrically connected to the sealing-member-side second bonding pattern 421. Also, the first external electrode terminal 431 and the second external electrode terminal 432 are not electrically connected to the sealing-member-side second bonding pattern 421. In the crystal resonator 101, the B1 direction in FIG. 6 equals the X axis direction in FIG. 5, and the B2 direction in FIG. 6 equals the Z' axis direction in FIG. 5.

In the crystal resonator 101 having the above configuration, the crystal resonator plate 2 and the first sealing member 3 are subjected to diffusion bonding in a state in which the resonator-plate-side first bonding pattern 251 and the sealing-member-side first bonding pattern 321 are superimposed on each other, and the crystal resonator plate 2 and the second sealing member 4 are subjected to the diffusion bonding in a state in which the resonator-plate-side second bonding pattern 252 and the sealing-member-side second bonding pattern 421 are superimposed on each other, thus, the package 12 having the sandwich structure as shown in FIG. 1 is produced. In contrast to the conventional art, no special bonding material, such as an adhesive, is needed separately. Thus, the internal space 13 of the package 12, i.e. the space for housing the vibrating part 22 is hermetically sealed. The resonator-plate-side first bonding pattern 251 and the sealing-member-side first bonding pattern 321 themselves serve as the bonding material 11 formed upon the diffusion bonding. The resonator-plate-side second bonding pattern 252 and the sealing-member-side second bonding pattern 421 themselves serve as the bonding material 11 formed upon the diffusion bonding. The respective bonding materials 11 are formed so as to have an annular shape in plan view. In this embodiment, the entire wiring from the first and the second excitation electrodes 221 and 222 of the crystal resonator plate 2 to the first external electrode terminal 431 and the second external electrode terminal 432 is formed inside the bonding materials 11 in plan view. The bonding materials 11 are formed so as to be close to the outer peripheral edge of the package 12 in plan view. In this way, it is possible to increase the size of the vibrating part 22 of the crystal resonator plate 2.

At this time, the respective connection bonding patterns as described above are also subjected to the diffusion bonding in a state in which they are superimposed on each other. Specifically, the connection bonding pattern 264 of the crystal resonator plate 2 and the connection bonding pattern 35 of the first sealing member 3 are subjected to the diffusion bonding. The connection bonding pattern 27 of the crystal resonator plate 2 and the connection bonding pattern 36 of the first sealing member 3 are subjected to the diffusion bonding. The connection bonding pattern 265 of the crystal resonator plate 2 and the connection bonding pattern 453 of the second sealing member 4 are subjected to the diffusion bonding. The connection bonding pattern 28 of the crystal resonator plate 2 and the connection bonding pattern 463 of the second sealing member 4 are subjected to the diffusion bonding. Then, the respective pairs of the connection bonding patterns become bonding materials 14 formed upon the diffusion bonding. The bonding materials 14 formed upon the diffusion bonding serve to establish conduction between the through electrodes of the through holes and the bonding materials 14, and to hermetically seal the bonding portions. Since the bonding materials 14 are formed inside the bonding materials 11 for sealing in plan view, they are shown by the broken line in FIG. 1.

Here, the first through hole 26 and the second through hole 45 are disposed so as not to be superimposed on each other in plan view. Specifically, as shown in FIG. 6, the first through hole 26 and the second through hole 45 are vertically linearly arranged in front view (i.e. when viewed from the B1 direction in FIG. 6). For convenience sake, in FIG. 6, the first through hole 26 formed in the crystal resonator plate 2 disposed above the second sealing member 4 is shown by the dashed double-dotted line. On the other hand, the first through hole 26 and the second through hole 45 are offset from each other so as not to be vertically linearly arranged in side view (i.e. when viewed from the B2 direction in FIG. 6). More specifically, the first through hole 26 is connected to one end part of the bonding material 14 (the connection bonding patterns 265 and 453) in the longitudinal direction thereof (in the B1 direction), and the second through hole 45 is connected to the other end part of the bonding material 14 in the longitudinal direction thereof. Thus, the through electrode 261 of the first through hole 26 is electrically connected to the through electrode 451 of the second through hole 45 via the bonding material 14. In this way, by arranging the first through hole 26 and the second through hole 45 so as not to be superimposed on each other in plan view, the package 12 can have a more preferable configuration in order to ensure the hermeticity of the internal space 13 in which the vibrating part 22 of the crystal resonator plate 2 is hermetically sealed.

In the package 12 produced as described above, the first sealing member 3 and the crystal resonator plate 2 have a gap of not more than 1.00 μm. The second sealing member 4 and the crystal resonator plate 2 have a gap of not more than 1.00 μm. That is, the thickness of the bonding material 11 between the first sealing member 3 and the crystal resonator plate 2 is not more than 1.00 μm, and the thickness of the bonding material 11 between the second sealing member 4 and the crystal resonator plate 2 is not more than 1.00 μm (specifically, the thickness in the Au—Au bonding of this embodiment is 0.01 to 1.00 μm). As a comparative example, the conventional metal paste sealing material containing Sn has a thickness of 5 to 20 μm.

In the crystal resonator 101 having the sandwich structure of this embodiment, the wiring pattern 33, which is connected to the first excitation electrode 221 of the crystal resonator plate 2, is provided on the second main surface 312 of the first sealing member 3, i.e. on the surface facing the crystal resonator plate 2. It is preferable that at least part of the wiring pattern 33 is superimposed on the space (i.e. cut-out part 21) between the vibrating part 22 and the external frame part 23 in plan view, and that the wiring pattern 33 is not superimposed on the first excitation electrode 221 and the second excitation electrode 222 in plan view.

With the above-described configuration, it is possible to effectively use the second main surface 312 of the first sealing member 3 as the region in which the wiring pattern 33 is disposed, which leads to downsizing of the crystal resonator 101 while maintaining the size of the vibrating part 22. In other words, it is not necessary to separately prepare, on the crystal resonator plate 2, the region in which the wiring pattern 33 is disposed, which allows increase in the size of the vibrating part 22. As a result, it is not necessary to reduce the size of the vibrating part 22 too much in order to meet the requirement to reduce the size of the crystal resonator 101.

Also, since the second main surface 312 of the first sealing member 3 is formed as a flat surface, the thickness of the first sealing member 3 can be reduced, which contributes to reduction in height of the crystal resonator 101. That is, if a recess part is disposed in the second main surface 312 of the first sealing member 3, the thickness of the first sealing member 3 may be increased by the depth of the recess part. However, by forming the second main surface 312 of the first sealing member 3 as a flat surface, it is possible to prevent the thickness of the first sealing member 3 from being increased. Thus, it is possible to improve reduction in height of the crystal resonator 101. In this case, the vibrating part 22 and the connecting part 24 of the crystal resonator plate 2 are made thinner than the external frame part 23, which is beneficial for prevention of the contact of the vibrating part 22 with the first sealing member 3 and the second sealing member 4 while reducing the height of the crystal resonator 101.

In this embodiment, the first sealing member 3 and the second sealing member 4 are made of glass, however, the present invention is not limited thereto. They may be made of crystal.

The above embodiments of the present invention are merely described as examples in which the present invention is embodied, and thus are not intended to restrict the technical scope of the present invention. In the above embodiments, the crystal resonator is used for the crystal resonator device. However, the present invention is not limited thereto. The present invention may be applied to a crystal resonator device other than the crystal resonator (e.g. crystal oscillator).

This application claims priority based on Patent Application No. 2016-167646 filed in Japan on Aug. 30, 2016. The entire contents thereof are hereby incorporated in this application by reference.

INDUSTRIAL APPLICABILITY

The present invention is suitable for a crystal resonator device (such as a crystal resonator and a crystal oscillator) in which crystal is used as a material of a substrate of a piezoelectric resonator plate.

DESCRIPTION OF REFERENCE NUMERALS

101 Crystal resonator
12 Package
13 Internal space
2 Crystal resonator plate
21 Cut-out part
22 Vibrating part
221 First excitation electrode
222 Second excitation electrode
223 First extraction electrode
224 Second extraction electrode
23 External frame part
24 Connecting part
3 First sealing member
4 Second sealing member

The invention claimed is:

1. An AT-cut crystal resonator plate having a rectangular shape in plan view, comprising:
a first main surface;
a second main surface;
a vibrating part having a rectangular shape in plan view, the vibrating part being disposed on a center part of the AT-cut crystal resonator plate so as to have a first excitation electrode on the first main surface and to have a second excitation electrode on the second main surface;
a cut-out part formed along an outer periphery of the vibrating part;
an external frame part having a rectangular-shaped inner peripheral edge in plan view, the external frame part being formed along an outer periphery of the cut-out part; and
a connecting part configured to connect the vibrating part to the external frame part, the connecting part extending, in a Z' axis direction of the vibrating part, from one end part of a side of the vibrating part along an X axis direction, so as to be connected to only the inner peripheral edge of the external frame part along the X axis direction, wherein
a first wide part is formed on a side surface of the connecting part on a +X axis side such that a width of the first wide part gradually increases from the vibrating part only toward the external frame part,
a second wide part is formed on a side surface of the connecting part on a −X axis side, and
the first wide part and the second wide part are formed so as to have respective shapes asymmetric to each other.

2. The AT-cut crystal resonator plate according to claim 1, wherein
the first wide part and the second wide part are disposed on the connecting part on a −Z' axis side.

3. The AT-cut crystal resonator plate according to claim 2, wherein
a third wide part is disposed on the side surface of the connecting part on the −X axis side so as to also position on a +Z' axis side of the connecting part, and
the third wide part is formed such that a width thereof gradually decreases from the vibrating part toward the external frame part.

4. The AT-cut crystal resonator plate according to claim 1, wherein
the first wide part and the second wide part are disposed on the connecting part on a −Z' axis side.

5. The AT-cut crystal resonator plate according to claim 4, wherein
a third wide part is disposed on the side surface of the connecting part on the −X axis side so as to also position on a +Z' axis side of the connecting part, and
the third wide part is formed such that a width thereof gradually decreases from the vibrating part toward the external frame part.

6. The AT-cut crystal resonator plate according to claim 5, wherein
the third wide part is formed smaller than the first wide part and the second wide part in plan view.

7. The AT-cut crystal resonator plate according to claim 1, wherein
an expanded part is formed on the external frame part such that the expanded part is located at a position diagonal to the connecting part in plan view with a center of the vibrating part being interposed therebetween, and that the expanded part expands from the inner peripheral edge of the external frame part toward the cut-out part.

8. A crystal resonator device comprising:
the AT-cut crystal resonator plate according to claim 1;

a first sealing member configured to cover the first main surface of the AT-cut crystal resonator plate; and a second sealing member configured to cover the second main surface of the AT-cut crystal resonator plate.

9. An AT-cut crystal resonator plate having a rectangular shape in plan view, comprising:

a first main surface;

a second main surface;

a vibrating part having a rectangular shape in plan view, the vibrating part being disposed on a center part of the AT-cut crystal resonator plate so as to have a first excitation electrode on the first main surface and to have a second excitation electrode on the second main surface;

a cut-out part formed along an outer periphery of the vibrating part;

an external frame part having a rectangular-shaped inner peripheral edge in plan view, the external frame part being formed along an outer periphery of the cut-out part; and a connecting part configured to connect the vibrating part to the external frame part, the connecting part extending, in a Z' axis direction of the vibrating part, from one end part of a side of the vibrating part along an X axis direction, so as to be connected to only the inner peripheral edge of the external frame part along the X axis direction, wherein a first wide part is formed on a side surface of the connecting part on a +X axis side such that a width of the first wide part gradually increases from the vibrating part only toward the external frame part, a second wide part is formed on a side surface of the connecting part on a −X axis side, the first wide part and the second wide part are disposed on the connecting part on a −Z' axis side, a third wide part is disposed on the side surface of the connecting part on the −X axis side so as to also position on a +Z' axis side of the connecting part, and the third wide part is formed such that a width thereof gradually decreases from the vibrating part toward the external frame part, and the third wide part is formed smaller than the first wide part and the second wide part in plan view.

10. An AT-cut crystal resonator plate having a rectangular shape in plan view, comprising:

a first main surface;

a second main surface;

a vibrating part having a rectangular shape in plan view, the vibrating part being disposed on a center part of the AT-cut crystal resonator plate so as to have a first excitation electrode on the first main surface and to have a second excitation electrode on the second main surface;

a cut-out part formed along an outer periphery of the vibrating part;

an external frame part having a rectangular-shaped inner peripheral edge in plan view, the external frame part being formed along an outer periphery of the cut-out part; and a connecting part configured to connect a corner part of the vibrating part to only one side that is the inner peripheral edge of the external frame part, wherein a first wide part is formed on one side surface of a pair of side surfaces facing each other of the connecting part such that a width of the first wide part gradually increases from the vibrating part only toward the external frame part, a second wide part is formed on the other side surface of the pair of side surfaces of the connecting part, and the first wide part and the second wide part are formed so as to have respective shapes asymmetric to each other.

* * * * *